United States Patent [19]

Clinton

[11] Patent Number: 4,924,175
[45] Date of Patent: May 8, 1990

[54] APPARATUS FOR DISPLAYING ANALOG SIGNATURES OF AN ELECTRONIC COMPONENT

[76] Inventor: James R. Clinton, 3622 SW. Donovan, Seattle, Wash. 98126

[21] Appl. No.: 162,192

[22] Filed: Feb. 29, 1988

[51] Int. Cl.⁵ .................... G01R 31/22; G01R 13/20
[52] U.S. Cl. ............................ 324/73.1; 324/121 R; 324/158 T; 324/158 R
[58] Field of Search .......... 324/158 R, 158 D, 158 T, 324/73 R, 115, 73 AT, 121 R; 364/481, 487

[56] References Cited

U.S. PATENT DOCUMENTS

| | | | |
|---|---|---|---|
| 3,676,767 | 7/1972 | Boelter | 324/158 T |
| 4,072,851 | 2/1978 | Rose | 364/487 X |
| 4,386,317 | 5/1983 | Clinton | 324/158 D |
| 4,456,880 | 6/1984 | Warner et al. | 324/158 T |
| 4,555,765 | 11/1985 | Crooke et al. | 364/487 X |
| 4,695,833 | 9/1987 | Ogura et al. | 324/121 R X |
| 4,763,066 | 8/1988 | Yeung et al. | 324/158 R |
| 4,764,728 | 8/1988 | Sato et al. | 324/158 D |
| 4,774,456 | 9/1988 | Miller | 324/158 T |

OTHER PUBLICATIONS

Dollekamp et al; "P²CCD in 60 MHz Oscilloscope with Digital Image Storage"; Philips Tech. Rev. 40, No. 2/3; 1982; pp. 55–68.

Primary Examiner—Reinhard J. Eisenzopf
Assistant Examiner—Vinh P. Nguyen
Attorney, Agent, or Firm—Seed and Berry

[57] ABSTRACT

An apparatus for displaying analog signatures of an electronic device is attached to the electronic device and periodically subjects the electronic device to one, two, three or four selected test conditions. The responses of the electronic device to each of the test conditions are received as a pair of response signals, which constitute an analog signature of the electronic device. The two signals in each signature are respectively used to drive horizontal and vertical deflections of a CRT, which causes the signatures corresponding to each of the selected test conditions to be displayed simultaneously. If desired, the apparatus can be attached to a second electronic device, the selected test conditions alternately applied to the two devices, and the corresponding signatures alternately displayed on the CRT. This allows comparisons of the two electronic devices to be readily made.

25 Claims, 23 Drawing Sheets

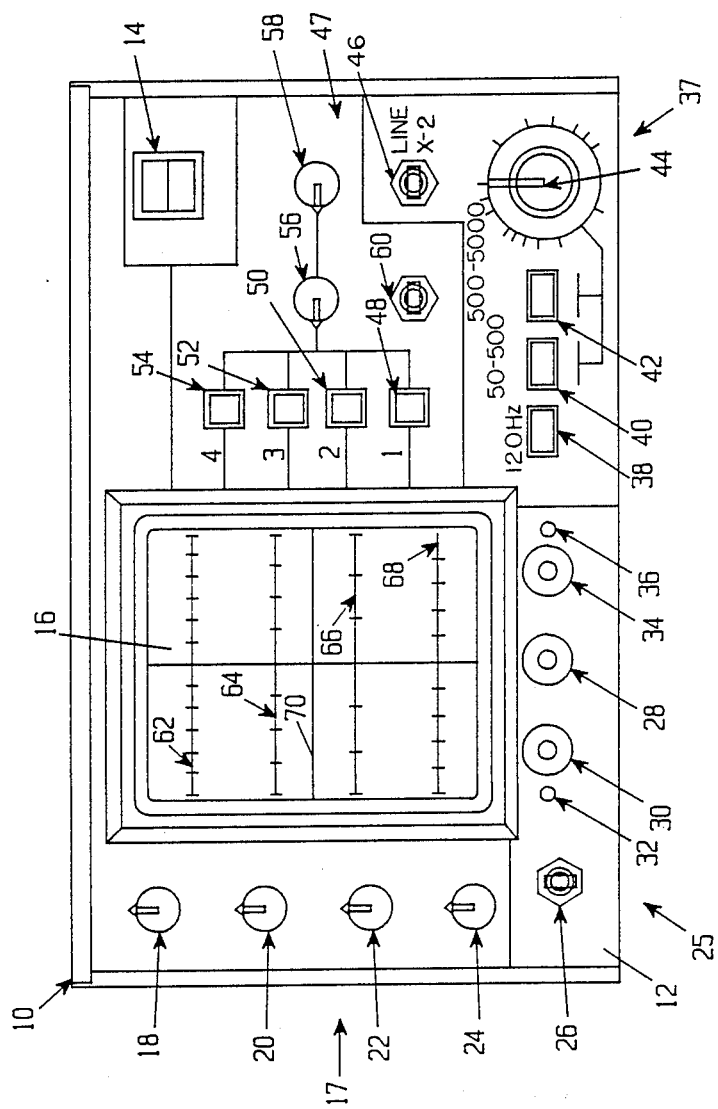

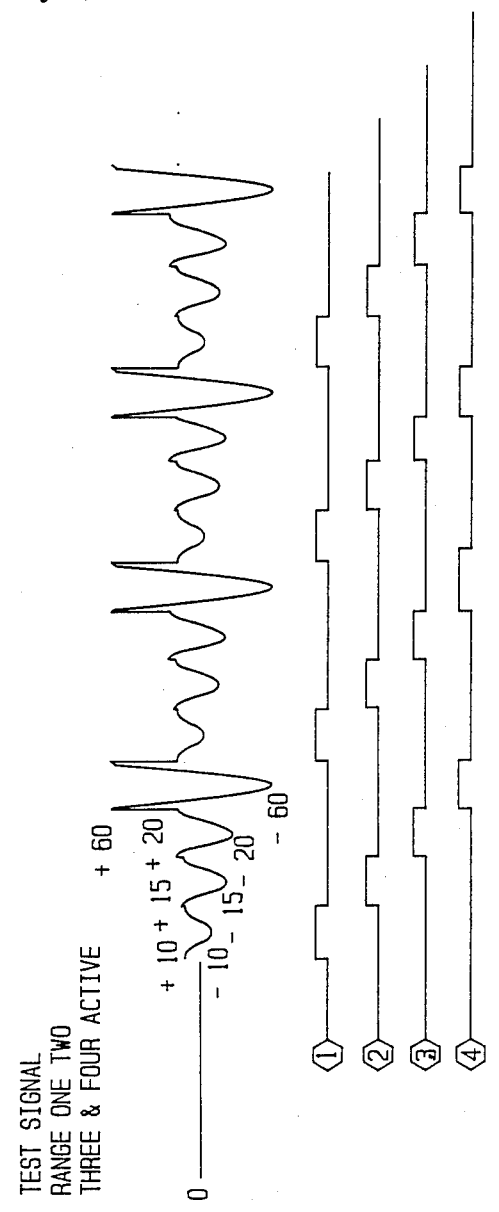

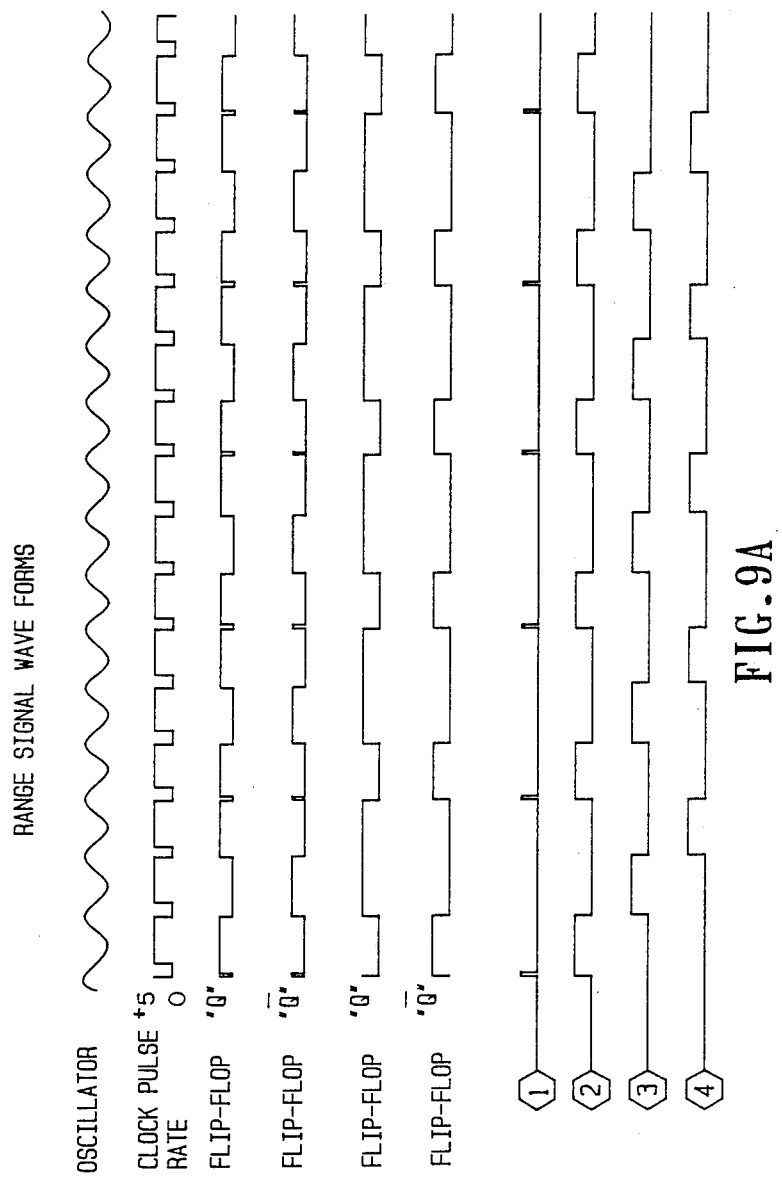

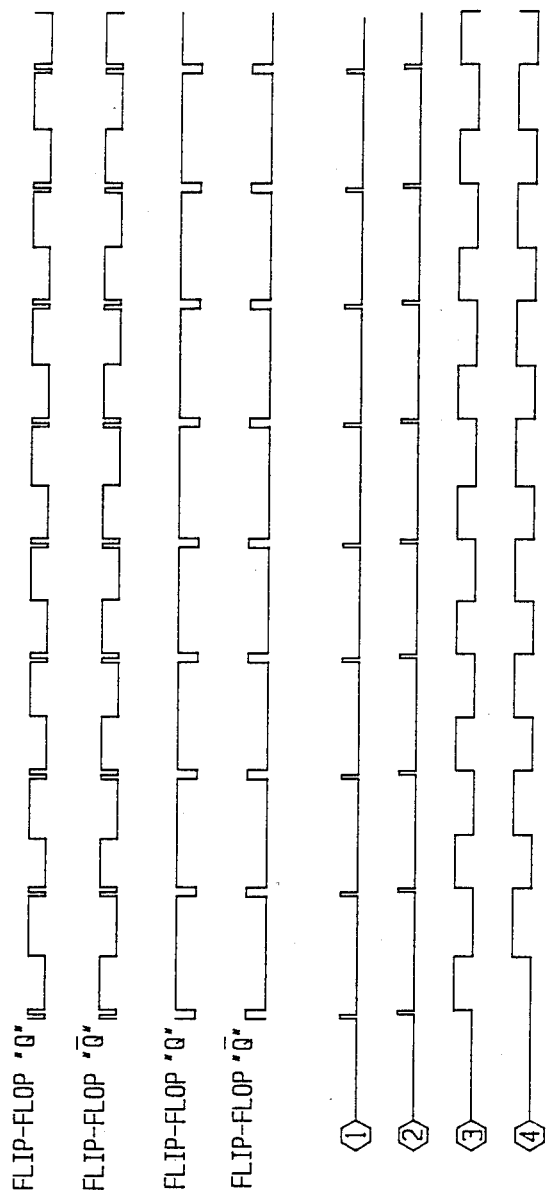

TRUTH TABLE

| D | C | B | A | X | Y | Z | CLOCK LOCKOUT |
|---|---|---|---|---|---|---|---|
| 0 | 0 | 0 | 0 | 0 | 1 | 1 | NO |
| 0 | 0 | 0 | 1 | 1 | 1 | 0 | YES |
| 0 | 0 | 1 | 0 | 1 | 1 | 0 | YES |
| 0 | 0 | 1 | 1 | 0 | 0 | 1 | NO |
| 0 | 1 | 0 | 0 | 1 | 1 | 0 | YES |
| 0 | 1 | 0 | 1 | 0 | 1 | 1 | NO |
| 0 | 1 | 1 | 0 | 0 | 1 | 1 | NO |
| 0 | 1 | 1 | 1 | 1 | 0 | 1 | NO |
| 1 | 0 | 0 | 0 | 1 | 1 | 0 | YES |
| 1 | 0 | 0 | 1 | 0 | 1 | 1 | NO |
| 1 | 0 | 1 | 0 | 0 | 1 | 1 | NO |
| 1 | 0 | 1 | 1 | 1 | 0 | 1 | NO |
| 1 | 1 | 0 | 0 | 0 | 0 | 1 | NO |
| 1 | 1 | 0 | 1 | 1 | 0 | 1 | NO |
| 1 | 1 | 1 | 0 | 1 | 0 | 1 | NO |
| 1 | 1 | 1 | 1 | 0 | 0 | 1 | NO |
|   |   |   |   |   |   |   |   |

4,924,175

APPARATUS FOR DISPLAYING ANALOG SIGNATURES OF AN ELECTRONIC COMPONENT

DESCRIPTION

1. Technical Field

This invention relates to electronic test apparatus, and more particularly, to electronic test apparatus for testing electronic components.

2. Background Art

It has been known, as first described in RCA Technical Bulletin "Television Service Tips for Transistor Testing" (dated Jan. 7, 1972), that a 60 Hz power line voltage could be used as a testing signal source with a transformer for impedance forming and voltage reduction. A resistor network was used to provide a voltage corresponding to the current and voltage vectors for the device under test. The display device used was any oscilloscope that had adequate vertical and horizontal deflection. The circuit provided a single current/voltage source for a device under test.

The circuitry described in the RCA bulletin had the disadvantages of unsure adjustments of the vertical and horizontal circuitry of the oscilloscope and the inability to test all quality defects in the device under test. In addition, if the device to be tested was bridged by other lower impedance devices, testing was very difficult or impossible.

Subsequently, other instrument manufacturers provided testing instruments having a built-in display and provisions for manually switching to three different voltage/current test conditions. The instrument also had a very low impedance test condition for testing devices that were bridged by other devices. This instrument displayed a single "signature" on the display device for each test range.

Since any single current/voltage test condition may show a quality defect in the device under test, while others may not, it is necessary to switch among all of the test conditions of the instrument to completely test the device. Although some of the test instruments known in the prior art featured automatic range switching, there were no known instruments which could simultaneously display all of the test conditions to which the device under test was being subjected. The ability to view only one test condition trace at a time is both very inconvenient and confusing, and can lead to operator fatigue.

In addition, the test instruments known to the prior art featured only fixed test signal frequencies. As a result, it was not possible to test devices with a continuously variable test frequency, particularly those devices having reactive components, such as capacitors.

Therefore, it is desirable to have a test instrument that can simultaneously display signatures from all of the test conditions to which the electronic device being tested is subjected. It is also desirable to have a test instrument that is capable of testing an electronic device over a continuously variable frequency range.

DISCLOSURE OF THE INVENTION

In one aspect, the present invention provides an apparatus for testing an electronic device. The apparatus comprises means for selecting a plurality of conditions under which the electronic device is to be tested, means for generating an analog input signal corresponding to said selected plurality of test conditions, and means for applying said input signal to the electronic device to produce a corresponding response of the electronic device and generating a pair of analog output signals indicative of said response. In addition, the apparatus includes means for producing a plurality of pairs of analog signature signals from said pair of output signals, one of said pairs of signature signals corresponding to each of said selected plurality of test conditions, and means for simultaneously displaying said plurality of pairs of signature signals.

In another aspect, the apparatus includes means for sequentially selecting first and then second pluralities of conditions under which the electronic device is to be tested and means for sequentially generating first and then second analog input signals, said first and second input signals respectively corresponding to said first and second pluralities of selected test conditions. The apparatus further includes means for sequentially applying said first and then said second input signals to the electronic device to produce corresponding first and second analog responses of the electronic device and generating first and second pairs of analog output signals respectively indicative of said first and second responses. Means are also provided for sequentially producing a first plurality of first pairs of analog signature signals from said first pair of output signals and then a second plurality of second pairs of signature signals from said second pair of output signals, said first plurality of first pairs of signature signals corresponding to said first plurality of selected test conditions and said second plurality of second pairs of signature signals corresponding to said second plurality of selected test conditions. Further, the apparatus comprises means for periodically sampling said first plurality of first pairs of signature signals and producing digital signals corresponding to said samples, memory means for storing said digital signals, means for retrieving said stored digital signals from said memory means and producing reconstructed first pairs of analog signature signals, and means for simultaneously displaying said reconstructed first plurality of first pairs of signature signals and said second plurality of second pairs of signature signals.

BRIEF DESCRIPTION OF THE DRAWINGS

FIG. 1 is a front elevational view of the front panel of a test instrument incorporating the present invention.

FIG. 3(B) is a time history of a second test signal provided by the test instrument of FIG. 1.

FIG. 3(D) is a time history of the oscillator output signal of the test instrument of FIG. 1.

FIG. 9(A) is a time history of internal signal waveforms provided by the test instrument of FIG. 1 when the instrument is operating under a third test condition.

FIG. 9(B) is a time history of internal signal waveforms provided by the test instrument of FIG. 1 when the instrument is operating under a fourth test condition.

BEST MODE FOR CARRYING OUT THE INVENTION

Figure 2A:
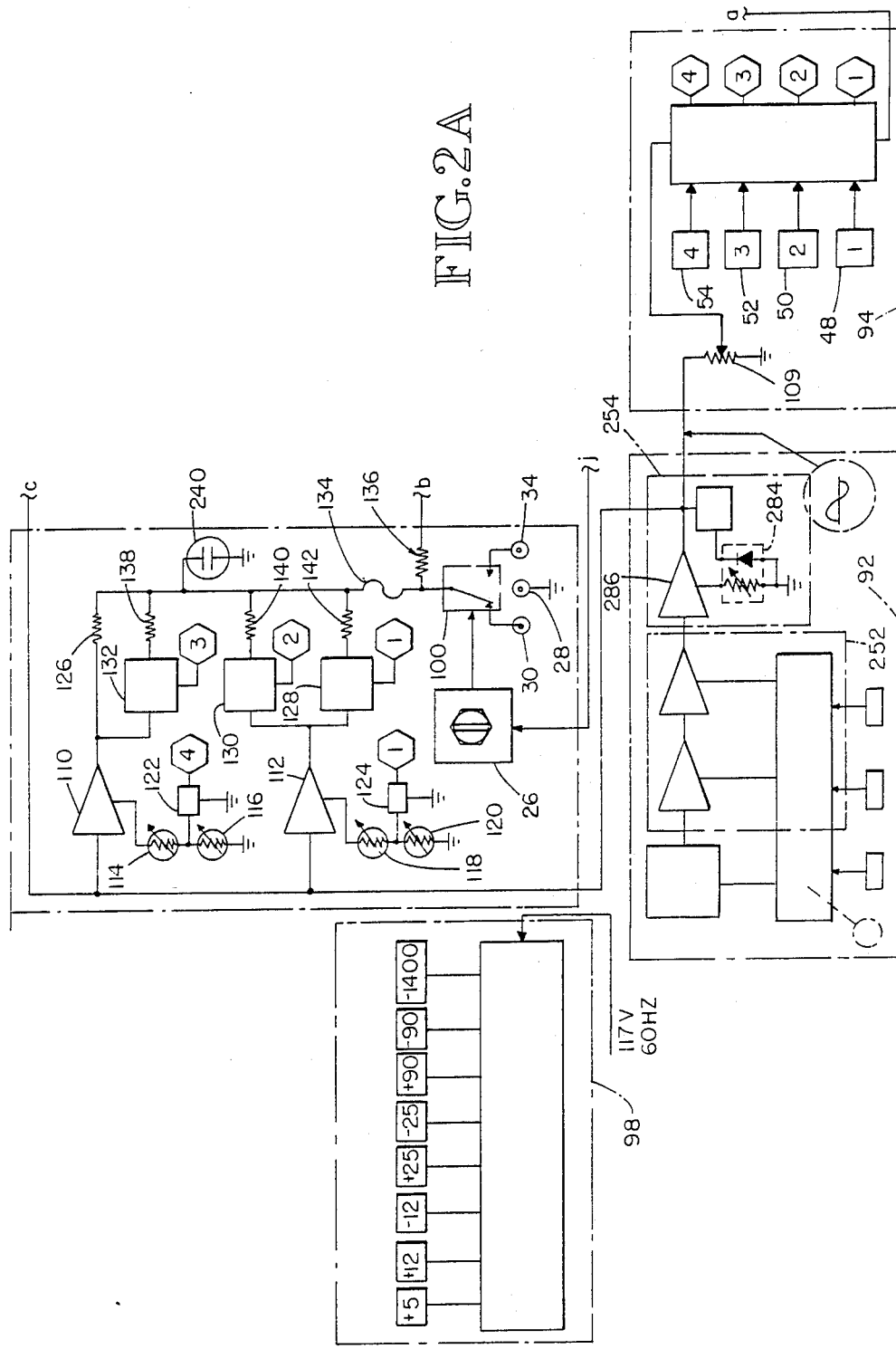
FIG. 2(A) is the first portion of a diagram of the subsystems of the test instrument of FIG. 1.

FIG. 1 is a diagram of one embodiment of the test instrument 10 of the invention. The front panel 12 can be seen to present a power switch 14, a display 16, display controls 17, and input functions 25. The front panel 12 also presents waveforms frequency controls 37 and waveform display controls 47.

Operation of the power switch 14 alternately activates and deactivates the test apparatus 10. The display 16, typically a cathode-ray tube (CRT), displays at least one or more waveforms (not shown in FIG. 1) that represent the response or responses of one or two electronic devices connected to the test apparatus 10 at test points 28, 30 and 34, which are included in the input functions 25. The test conditions applied to the electronic device(s) are determined by the waveform frequency controls 37, and the responses displayed are determined by the test range buttons 48–54, which are included in the waveform display control 47.

One electronic device can be attached to the test instrument 10 between common ground test point 28, which is connected to the instrument's electrical ground, and either left test point 30 or right test point 34, each of which define separate channels of the test instrument 10. A second electronic device (if any) can be attached between ground test point 28 and the remaining unused test point 30 or 34. The response waveforms of the electronic device(s) under test are normally displayed along separate reference systems with respect to horizontal axes 62–68. However, if desired, the selected response waveforms can also be displayed along a common horizontal axis 70 by manipulation of the spread control 56, which is one of the waveform display controls 47.

There are four test conditions that can be chosen for testing the electronic device(s) connected to the test points 28, 30 and 34. These test conditions can be selected for viewing on display 16 by toggling test range buttons 48–54 (included in the waveform display controls 47) on or off. For example, test range signals 1, 2, and 4 can be chosen for display by turning on test range buttons 48, 50, and 54.

The display controls 17 affect parameters of the display 16 itself in the manner customary with CRT displays. Included in these display controls 17 are intensity control 18, focus control 20, horizontal control 22, and verical control 24. Intensity control 18 and focus control 20 control the CRT beam itself, while horizontal control 22 and vertical control 24 control the placement of the selected test condition waveforms on the display 16. Horizontal control 22 can control the horizontal placement of the selected test condition waveforms by being rotated counterclockwise or clockwise, and can also control the horizontal extent of each of the selected test condition waveforms by being pushed toward or pulled away from the front panel 12.

If one electronic device is attached to the test instrument 10, the waveforms representing its responses to the selected test conditions are displayed when the selection control 26, which is one of the input functions 25, is rotated toward the test point 30 or 34 to which the electronic device is connected. For example, if the electronic device is connected between ground test point 28 and left test point 30, rotating selection control 26 toward its "left" position, marked "L", will cause the selected test conditions to be displayed on the display 16. If two electronic devices are attached to the test apparatus 10, the responses of the two devices to the chosen test conditions are alternately displayed by rotating selection control 26 to its alternating position, marked "Alt."The left and right light-emitting diode (LED) displays 32 and 36, respectively (part of input functions 25), are illuminated, depending upon whether the electronic device is connected between the ground test point 28 and the left test point 30 or the right test point 34.

The frequency of the test conditions can be controlled by the waveform frequency controls 37. Activating the 120 Hz control 38 (of the waveform frequency controls 37) will cause the test conditions to be presented to the electronic device under test at a 120 Hz rate. A particular advantage of the present invention is that the test instrument 10 can test an electronic device at any frequency in a continuous range of frequencies. This ability means that the test instrument 10 can test an electronic device at frequencies that the test instruments of the prior art were unable to generate and can, consequently, test aspects of electronic devices in a way that was not previously possible. In this continuous frequency mode, the frequency of the test conditions is determined by frequency select buttons 40 and 42 and a continuous frequency control 44. By operation of the frequency select buttons 40 and 42, the frequency of the test conditions can be expanded to continuous ranges of 50–500 Hz and 500–5000 Hz, respectively. The frequency of the test conditions can also be controlled by the automatic frequency control (AFC) switch 46, which is one of the waveform frequency controls 37. The AFC switch 46 has three possible positions for automatically locking the test signal to a desired frequency. When in the "Line X-2" position, the AFC switch 46 causes the test conditions to be locked to twice the frequency of the power line supplying the test device 10. Other multiples of the power line frequency can be selected by operating the AFC switch 46 in conjunction with the continuous frequency control 44. In this mode, the test conditions will lock into the closest multiple of the power line frequency.

The test condition frequency can also be locked to any external signal that is connected to the AFC terminals (not shown) on the rear of the test instrument 10, so long as the external signal is in the range of 1 to 5 volts. To operate in this mode, the AFC switch 46 is placed in the "External" position and an appropriate voltage source connected to the AFC terminals. The test instrument 10 will operate in the conventional mode described above when the AFC switch 46 is in the "Off" position.

The selected test condition responses can also be affected by a phase control 58 and a rate control 60, which are also part of the display waveform controls 47. The phase control 58 is useful in compensating for test lead capacity when the test instrument 10 is operated at frequencies higher than 1000 Hz. With the test leads removed from the test terminals 28, 30, and 34 and the test condition frequency set at 5000 Hz, any residual capacity remaining in the instrument (evidenced by a split in the horizontal trace displayed) can be removed by manipulation of the phase control 58.

In the following description, the term "signatures" refers to the patterns that appear on the display 16. One, two, three or four separate signatures may appear on the display, as desired by the operator. These signatures are normally separated in a vertical direction but can be brought closer together as desired, or even overlapped by operation of a front panel spread control 56, which is one of the waveform display controls 47. Each signature represents a generic electrical characteristic for the electronic device under test for the voltage/current condition of the test. One signature will be generated for each range signal that is active.

Each signature will appear on the display 16 at its own respective position. If one signature is missing, the position for the missing signature will be vacant.

SYSTEM AND CIRCUIT DESCRIPTION

Figure 2B:
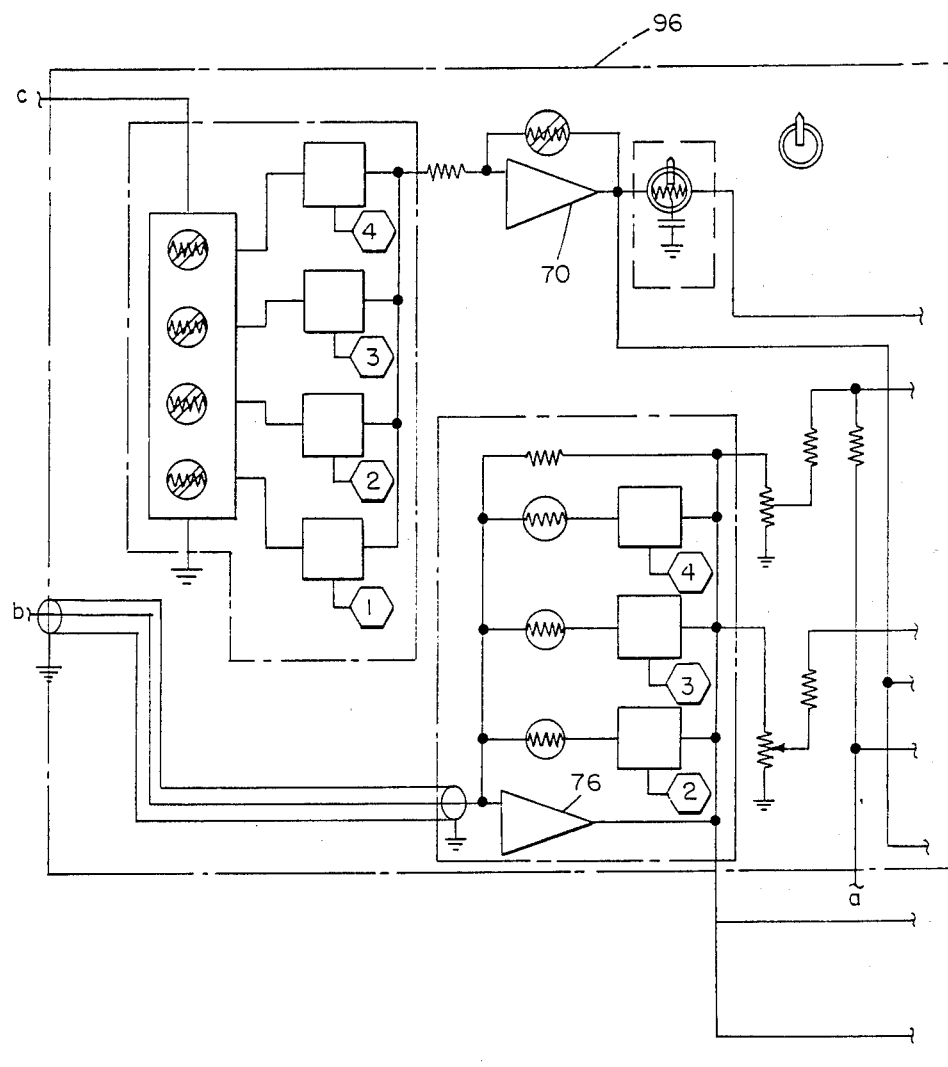
FIG. 2(B) is the second portion of a diagram of the subsystems of the test instrument of FIG. 1.

Referring to the simplified diagram of the test instrument 10 shown in FIGS. 2(A) and 2(B), it can be seen that the test device instrument 10 is composed of five primary subsystems, including a generator subsystem 90, an oscillator subsystem 92, a logic subsystem 94, a display subsystem 96, and a power supply subsystem 98. These subsystems will be sequentially described in detail below.

The logic subsystem 94 controls the generator subsystem 90 and display subsystem 96, by means of four range signals. The range signals are activated by the test range buttons 48–54. These signals will always be at logic level "0" or "1" at any one given time. In the figures accompanying this detailed description, a particular range signal is indicated by a range number enclosed in a hexagon. All range signals will be automatically activated when power is first applied to the test instrument 10. After initial power-up, any range signal can be eliminated from the display 16 by activating the appropriate test range button on the front panel. There must always be at least one range signal present, with one signature showing on the display 16. If only one range signal is active and the test range button for that signal is activated, the logic subsystem 94 will automatically activate all range signals and all signatures will be displayed.

If desired, the test instrument 10 can be provided with the capability to record the response of a first electric device to a first collection of test conditions and then alternately display this response with the response of the same, or a second, electronic device to a second collection of test conditions. This capability can be provided by a controller 70, which receives an activating input signal from the user of the test instrument 10. Upon receipt of this input signal, the controller 70 causes the A/D converter 72 to receive the horizontal and vertical trace signals that are being produced by the horizontal and vertical low level amplifiers 74 and 76, respectively. The signals received by the A/D converter 72 are then converted to digital form and stored in the random access memory (RAM) 78 until later recall by the controller 70. The controller 70 can cause the responses of the first electronic device to a predetermined number of periods of the test conditions to be recorded.

Upon the receipt of a second input from the user, the controller 70 causes the stored data to be read from the RAM 78, converted to analog signals by the D/A converter 80, and injected into the display subsystem 96 at the points from which they were taken when recorded. The controller 70 electronically actuates the select control 26 in any manner well-known to those skilled in the art to cause alternating displays of the recorded responses and the real-time responses of an electronic component converted to the ground test point 28 and the left or right test points, 30 and 34, respectively.

The Generator Subsystem 90

The generator subsystem 90 of the test instrument 10 generates the complex waveform that is placed across the electronic component under test. The output of the generator subsystem 90 is fed to the test points 28, 30, and 34 on the front panel 12 through a relay 100 that selects one of the test points 30 or 34.

Description of Waveforms:

Test signals are the signals that appear at the test points 28, 30, and 34. They are also the signals that are applied to the electronic device under test. In addition to being supplied to one of the test points, the test signal is applied to the horizontal deflection circuit low level amplifier 76 comprising part of the display subsystems 96. The test signals will be completely altered at the test points 28, 30, and 34 when an electronic device is placed across the test points 28, 30, and 34. These conditions will be discussed subsequently.

FIG. 3 shows the various combinations of test signals that will appear at the output test points 28, 30, and 34, depending on the ranges that are selected. Below each test signal are shown the range signals that determine the pattern of the test signal being generated by the logic subsystem 94. Any of the four range signals may be eliminated if so desired by activating the appropriate range select buttons 48–54 on the front panel 12. There must always be at least one range test signal present. Elimination of one or more range signals will not leave a gap in the test signal pattern. The logic capability necessary to accomplish this is generated within the logic subsystem 94.

Figure 3A:
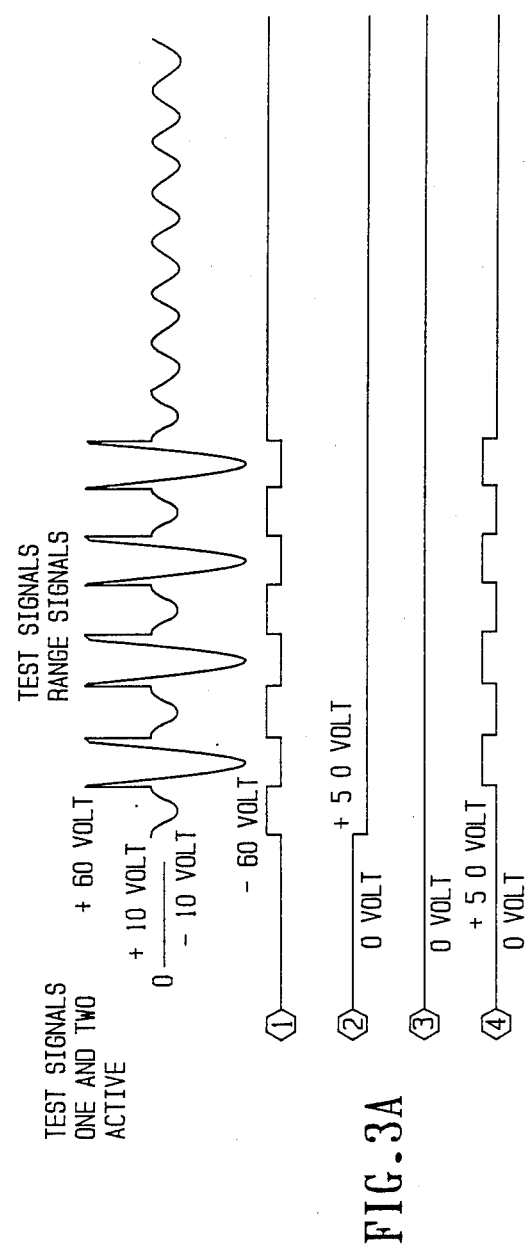
FIG. 3(A) is a time history of a first test signal provided by the test instrument of FIG. 1.

The test signals as shown in FIG. 3 will appear only when the test points 28, 30, and 34 are open. In other words, when an external device is not being tested. FIG. 3(A) shows a condition where range signal 1 and range signal 4 of the test signals are being generated and active, while range signals 2 and 3 are inactive. Initially, range signal 4 is turned off (deactivated) and only test signal 1 appears at the generator output.

In this embodiment, all test signals are sinusoidal signals that start and end near their positive peak, although other sinusoidal signals or even other periodic signals could also be used. The trigger point is on the positive-going slope immediately prior to the peak of the test signal. The exact trigger point is adjustable with a 25 turn trimpot 104 (clock level adjust) in the logic subsystem 94. This adjustment will be discussed in greater detail below in the description of the logic subsystem 94.

FIG. 3(B) shows all of range signals 1-4 being generated. All of the range signals are active. This pattern will probably be used for most testing because it determines a wide range of voltage/current test conditions that are necessary for adequately testing most devices.

Figure 3C:
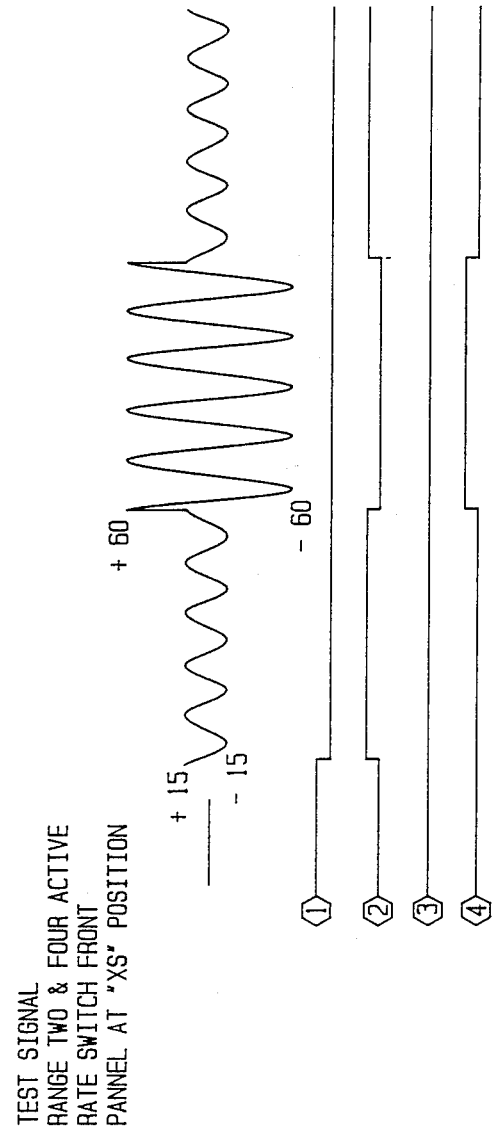
FIG. 3(C) is a time history of a third test signal provided by the test instrument of FIG. 1.

FIG. 3(C) shows a condition where range signal 1 and range signal 4 are being generated. Unlike in FIG. 3(A), where each range signal is active for exactly one oscillator cycle (see FIG. 3(D) for oscillator output signal), in FIG. 3(C) each range signal is active for five full oscillator cycles. This change in test modes is accomplished by switching the rate control 60 between the "X-1" and "X-5" positions. The "X-5" test mode is usually used in the 500 to 5000 Hz frequency range where CRT display blanking becomes a large portion of a single cycle. By displaying five cycles, the blanking portion of one cycle is masked so that it does not show on the signature. Five cycles of each test signal cannot be used at the lower test frequencies because of display flicker on the CRT display 16 resulting from the slow display rate. At the higher frequencies the display rate is high enough to eliminate the flicker.

FIG. 3(D) displays the oscillator output signal. The input to the generator subsystem 90 is a pure, continuous sinusoidal signal having a peak amplitude of plus or minus 3.8 volts peak (7.6 volts peak-peak) at the test frequency chosen for the test.

Figure 4:
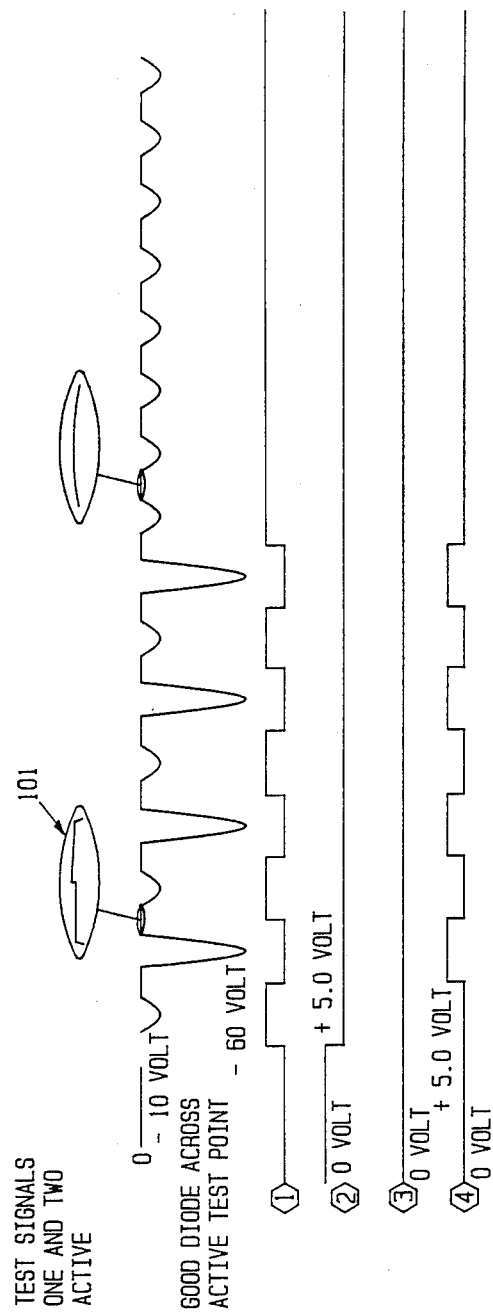
FIG. 4 is a time history of the actual signal provided to a diode by the test instrument of FIG. 1 when operating in accordance with FIG. 3(A).

FIG. 4 is the same test signal as shown FIG. 3(A) except that a high quality diode has been placed across the active test point, with the diode's anode connected to the selected test point 30 or 34, and the cathode connected to the ground test point 28. In this condition, the positive-going portion of each cycle of the test signal is limited to the forward conduction of the diode. When subjected to a high current test condition (e.g., test range one), the positive-going voltage level will reach approximately 1.2 volts. As shown in the close-up detail 101 of FIG. 4, at the midpoint where range signal 1 cuts in, the voltage is limited to approximately 0.75 volts.

Figure 2B:
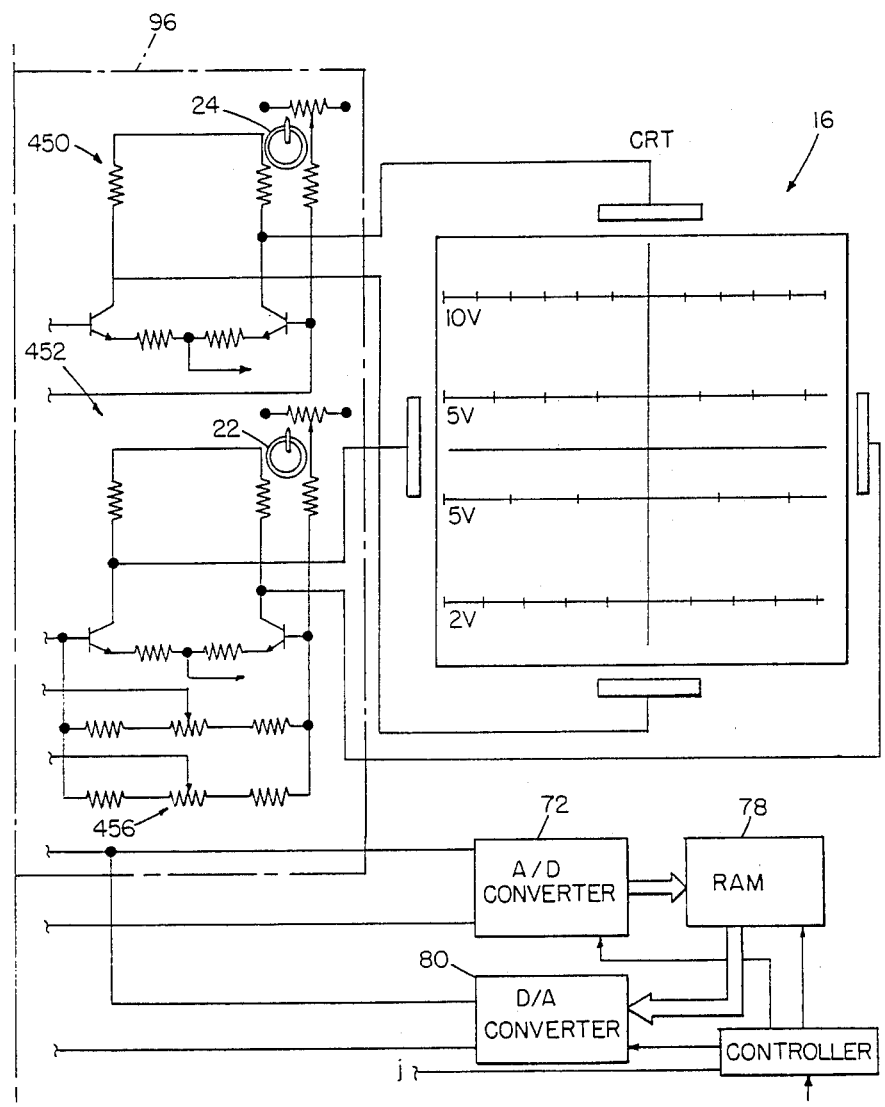

Description of Amplifiers:

As shown in FIG. 2, the input signal from the oscillator subsystem 92 to the generator subsystem 90 is amplified by a high level voltage amplifier 110 and a low voltage amplifier 112. High level voltage amplifier 110 has a low current capacity and low level voltage amplifier 112 has a high current capacity. Each of these amplifiers is capable of two distinct voltage output levels. The high level amplifier 110 can be switched to output levels of either plus or minus 60 volts peak (120 volts peak-peak) or plus or minus 20 volts peak (40 volts peak-peak). The maximum current that can be drawn from amplifier 110 is approximately 3 milliamps.

The low level amplifier 112 can be switched to output levels of either plus or minus 15 volts peak (30 volts peak-peak) or plus or minus 10 volts peak (20 volts peak-peak). The maximum current that can be drawn from amplifier 112 is approximately 300 milliamps.

Gain adjustments for all voltage conditions are done with trimpots 114-120. The gain of each of the amplifiers 110 and 112 is controlled by range signals provided by the logic subsystem 94. This is accomplished by electrically shorting one of the gain control trimpots 116 and 120 with analog switches 122 and 124, respectively.

Range signals 1, 2, 3 and 4 are five volt pulses that can be high continuously or for one or five complete oscillator cycles, as selected from the front panel 12 of the test instrument 10. Only one of the range signals can be high at any given time. Range signals are generated from a clock signal that is synchronous with the oscillator signal and output by the oscillator subsystem 92. Therefore, the range signals are always in phase with the test signal, and they change their period and frequency when the test signal is changed.

During the period that range signal 1 is high, the output of the low level amplifier 112 is plus or minus 10 volts peak (20 volts peak-peak). At all other times, the output of the low level amplifier 112 is plus or minus 15 volts peak (30 volts peak-peak).

During the period that range signal 4 is high, the output of the high level amplifier 110 is plus or minus 60 volts peak (120 volts peak-peak). At all other times, this output will be plus or minus 20 volts peak (40 volts peak-peak).

Both amplifiers 110 and 112 maintain their output voltage referenced to ground potential and each has voltage swings in both the positive and negative directions of equal magnitude.

The low level amplifier 112 feeds range 1 analog switch 128 and range 2 analog switch 130. The high level amplifier 110 feeds resistor 126 and range 3 analog switch 132.

During the period that range signal 4 is high, range 1, 2 and 3 analog switches 128-132 are off, so that plus or minus 60 volts is fed to the selected test point 30 or 34 through resistor 126, fuse 134, and the contact of the select relay 100 that has been selected by selection control 26. This signal is also fed to resistor 136. The peak current that can be drawn at test points 30 or 34 through resistor 126 is approximately 850 microamps. Resistors 126 and 136 form a voltage divider that determines the voltage level at the selected test point 30 or 34. This voltage is set at plus or minus 60 volts (120 volts peak-peak). The voltage that appears at the output of the high level amplifier 110 is approximately plus or minus 70 volts (140 volts peak-peak).

During the period that range signal 3 is high, range 3 analog switch 132 is on, range 1 and 2 analog switches 128 and 130 are off, and the output of high level amplifier 110 is approximately plus or minus 21 volts (42 volts peak-peak). When range 3 analog switch 132 is on, resistor 126 is in parallel with resistor 138. The maximum current that can be drawn at selected test point 30 or 34 is approximately 900 microamps. Plus or minus 20 volts (40 volts peak-peak) will appear across the selected test point.

During the period that range signal 2 is high, range 2 analog switch 130 is on, range 1 and 3 analog switches 128 and 132 are off, and the output of low level amplifier 112 is approximately plus or minus 15 volts (15 volts peak-peak). When range 2 analog switch 130 is on, resistor 126 will supply a small amount of current to the output selected test point 30 or 34, although dominant control will be through resistor 140. Plus or minus 15 volts (30 volts peak-peak) will appear across the selected test point.

During the period that range signal 1 is high, range 1 analog switch 128 is on, range 2 and 3 analog switches 130 and 132 are off, and the output of low level amplifier 112 is approximately plus or minus 10 volts (20 volts peak-peak). When range 1 analog switch 12 is on, resistor 126 will supply a small amount of current to the output selected test point 30 or 34, although dominant control will be through resistor 142. Plus or minus 10 volts (20 volts peak-peak) will appear across the selected test point.

Figure 5A:
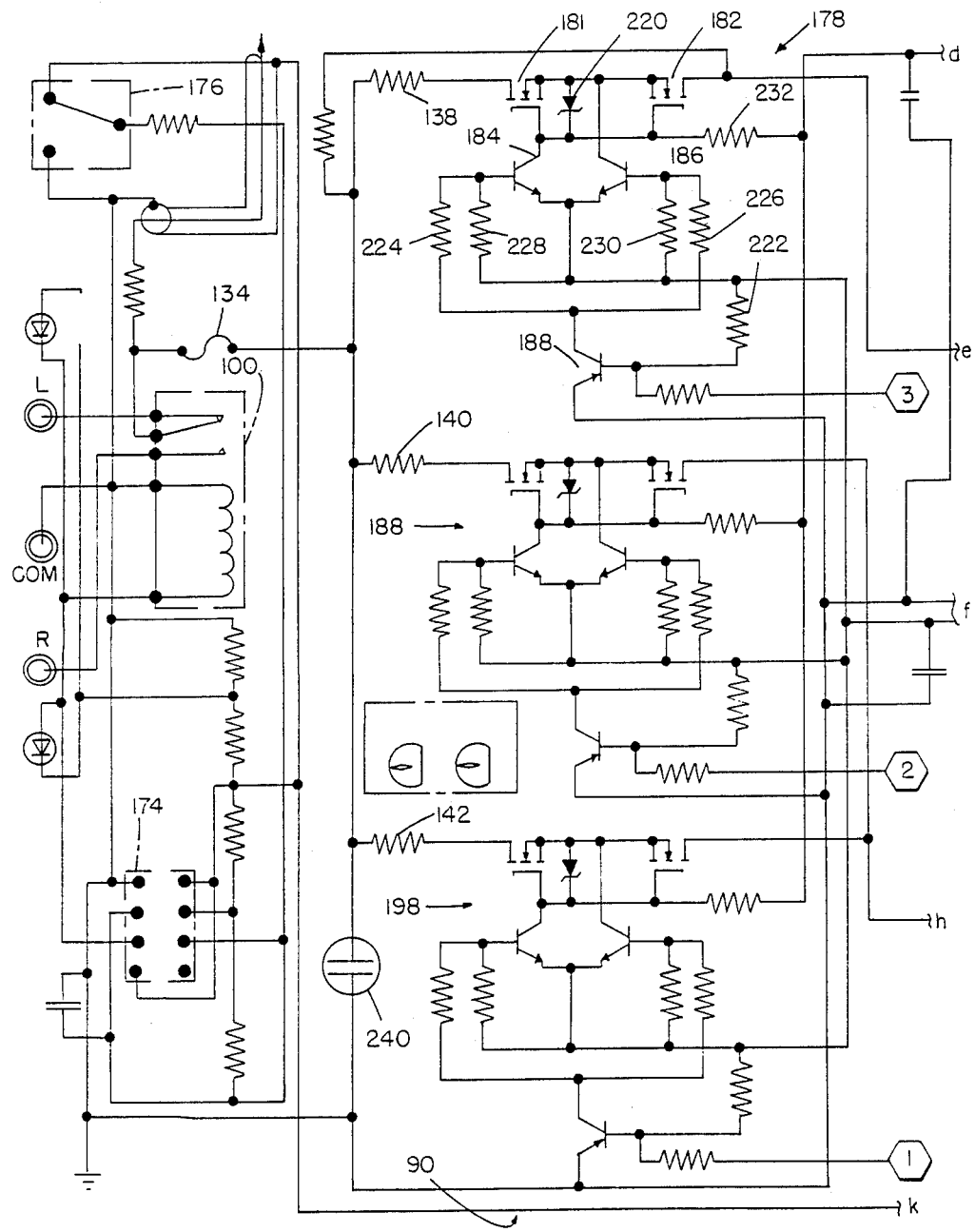
FIG. 5(A) is the first portion of a detailed circuit diagram of the generator subsystem shown in FIG. 2.
Figure 5B:
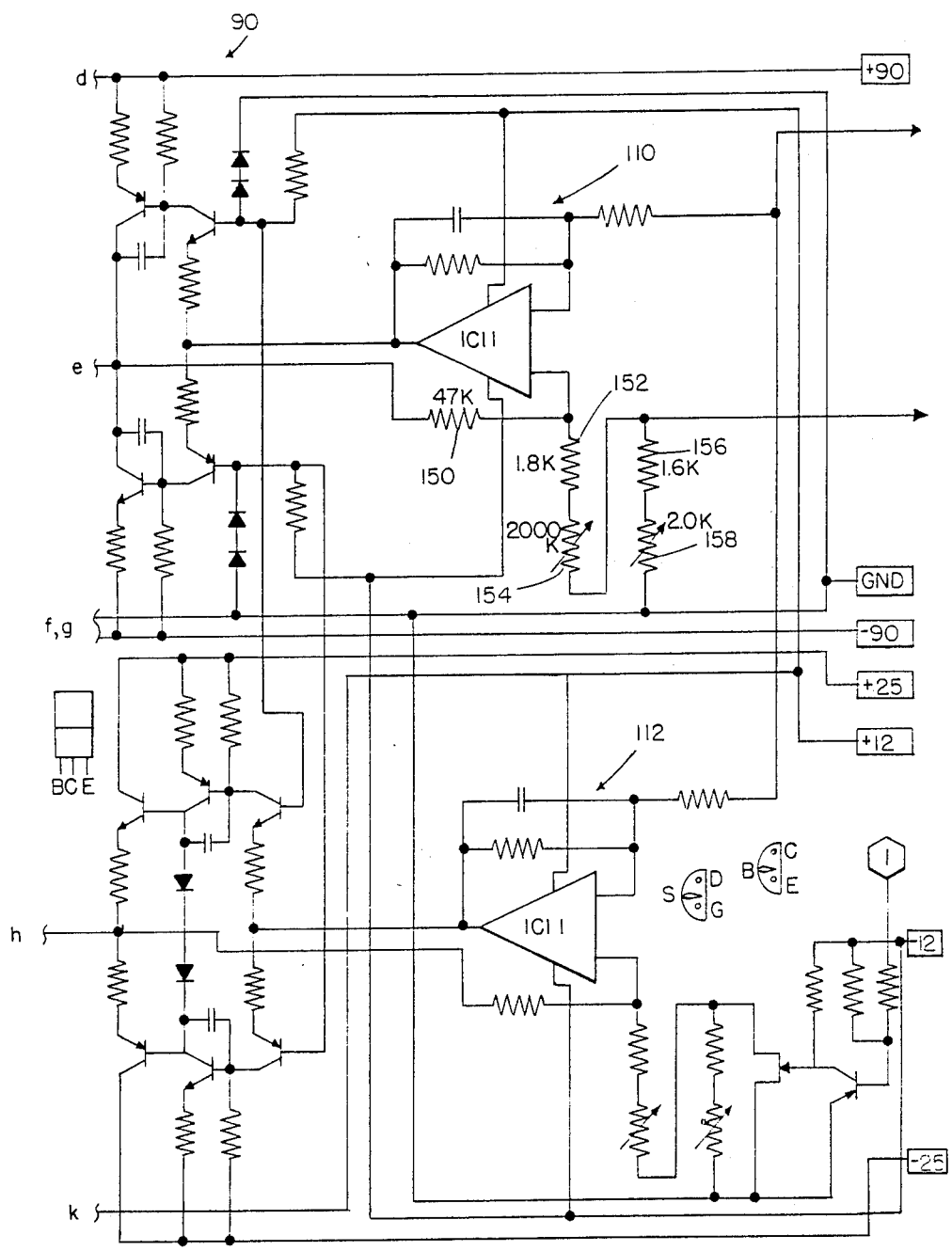
FIG. 5(B) is the second portion of a detailed circuit diagram of the generator subsystem shown in FIG. 2.

Description of Amplifiers Circuits:

Referring to FIGS. 5(A) and 5(B) for the detailed circuit schematic of the generator subsystem 90, the following is a detailed description of the circuit for the amplifiers 110 and 112.

The gain of both amplifiers 110 and 112 is controlled by changing the amount of negative feedback from output to input. The operational amplifier 149 of the high level amplifier 110 has its gain determined by the ratio of resistor 150 and the series combination of resistors 152-158, with resistors 154 and 158 being trimpot resistors. An analog switch (in integrated circuit IC7 of FIG. 12) is placed across resistors 156 and 158 and, when turned on, will short resistor 154 to ground. This will reduce the negative feedback through resistor 150 and increase the loop gain of the operational amplifier 149. High gain is set first by adjusting resistor 154, with range signal 4 in the high state. Low gain is then set with range signal 4 in the low state (analog switch IC7 turned off). The analog switch in IC7 is controlled by the test range buttons 48-54.

The output of the operational amplifier 149 will be given by the ratio of resistor 150 to the sum of the resistors 152-158 times the oscillator voltage of plus or minus 3.8 volts. Assuming that range signal 4 is high and that resistor 154 is at ground potential through the analog switch in IC7, when the center setting of trimpot resistor 154 is 1000 ohms, the operational amplifier 149 will have an output of 47000/(1800+1000) times 3.8 volts=63.8 volts peak.

When range signal 4 is low (off), the gain of the high level amplifier 110 will be 47000/(1800+1000+5600+1000) times 3.8 volts=19 volts peak. Both gain-setting trimpot resistors 154 and 158 are assumed to be at their center settings. Final adjustment for an output voltage of plus or minus 20 volts peak will be accomplished by setting resistor 158 to 530 ohms.

The circuit of the low level amplifier 112 is identical to that of the high level amplifier 110, except for the current driver output transistors 160 and 162. Gain of this amplifier is controlled by range signal 1.

The DC supply voltages (produced by the power supply subsystem 98) which provide power for the high and low level amplifiers 110 and 112 must have enough amplitude, both positive and negative, so that the amplifiers 110 and 112 do not saturate during their high, large output swings. Plus and minus 90 volts are provided for the high level amplifier 110. The low level amplifier 112 is powered by plus and minus 25 volts, and is capable of supplying the high current required.

Device Select Circuitry:

The device select circuitry can be set by the selection control 26 on the front panel 12 of the test instrument 10 to any one of three modes. The test signal can be directed to the left test point 30, the right test point 34 or can automatically switch between the two test points approximately once every second. The automatic feature can be used for comparison testing of two electronic devices—where one of these electronic devices is usually a known, good reference device.

The integrated circuit timer 174 in the generator subsystem 90 is a 555 timer chip connected to generate a square wave of approximately 1 Hz frequency. The output of the timer chip 174 is connected to a single pole-double throw relay 100 that switches the generator subsystem output to the selected one of the test points 30 or 34. An on-off-on switch 176 on the front panel 12, which is controlled by selection control 26, determines the state of the output of the timer 174, whether it be staying high, staying low or a square wave alternating between the high and low states.

High Level Analog Switches:

There are three high level analog switches 178, 188 and 198 used in the test instrument 10. All are identical and use solid state devices as their switching elements. These high level analog switches 178, 188 and 198 each correspond to one of the range signals 1, 2 or 3, respectively, and operate in two modes—on or off. Each of the three high level analog switches 178, 188 and 198 must have the following characteristics:

1. Must be able to isolate the inputs and outputs from the 120 peak-peak voltage swing of the high level amplifier 110.
2. Must present a minimum of circuit capacity to the output test points 30 and 34.
3. Must be able to switch on and off rapidly enough so that the test signal is not affected.
4. Must pass and isolate positive and negative voltage swings with equal transfer characteristics.

In addition, the range 3 high level analog switch 198 must have very low "on" resistance of relatively good linearity to eliminate distortion of the output signal.

The description of the high level analog switches 178, 188 and 198 will be made in terms of the range 3 switch 178 which includes transistors 180-188. The range 3 high level analog switch 178 is analogous to range 1 and 2 high level analog switches 188 and 198.

The switch portion of the high level analog switch 178 is composed of two high voltage enhancement mode MOS field effect transistors (MOSFETs) 180 and 182. Two transistors must be used in each switch because of the parasitic diode effect between the MOSFET's collector and drain, with the diode cathode toward the collector.

Both transistors 180 and 182 have a low saturation, or "on", resistance that remains fairly constant over the operating temperature range of the switch and is low enough so that it does not become a factor in limiting current through the high level analog switch 178.

The input to the high level analog switch 178 is at the drain of transistor 182 and the output is at the drain of transistor 180. The sources of the two transistors 180 and 182 are tied together and the gates of the two transistors 180 and 182 are tied together.

Diode 220 is a 30 volt Zener diode that limits the gate-to-source voltage to 30 volts positive and approximately 1 volt negative. This protects each of transistors 180 and 182 from being damaged.

An "off" condition exists for the high level analog switch 178 when range signal 3 is in the low state (0 volts). In this condition, transistor 188 is turned on by the base bias through resistor 222, and transistors 184 and 186 are turned on by the base bias provided through resistors 224 and 226. Transistors 184 and 186 are forced into saturation, bringing the collectors to approximately 90 volts. Since both the base and source of transistors 180 and 182 are at the same voltage these two transistors are turned off. This presents extremely high impedance to the signals appearing on both input and output to the high level analog switch 178.

An "on" condition exists when range signal 3 is in the high state (+5 volts). In this condition, transistor 188 is turned off with the base at approximately +3 volts relative to the emitter. Collector current thus ceases to flow through the bases of transistors 184 and 186, with resistors 228 and 230 bringing the base-emitter junction of transistors 184 and 186 to approximately the same voltage that turns them off.

The gates of transistors 180 and 182 are pulled positive by resistor 232, turning "on" both transistors 180 and 182 so that conduction occurs. Because of the low saturation or "bar" resistance of the transistors 180 and 182, the drain and source of each transistor 180 and 182 will be at essentially the same voltage. The voltage about which the switch swings is determined by the output impedance and voltage of the high level amplifier 110. The gates of both transistors 180 and 182 will be displaced by +30 volts above the voltage level of the source and drain because of the 30 volt Zener diode 220. Since the output impedance of the high level amplifier 110 is very low compared to the gate pull-up resistor 232, the source/drain of each transistor 180 and 182 will be at the amplifier output voltage.

As stated, the bar, or "on" resistance must be low, and constant. This is particularly important for range signal 1 where the peak test signal current is approximately 250 milliamps into a 33 ohm load. Since the peak voltage out of the low level amplifier 112 (which has a high current capacity) is 10 volts and 8.25 volts is dropped across the 33 ohm resistor 142, the other 1.75 volts must be dropped across the switch bar resistance. This makes the bar resistance approximately 7 ohms, which is acceptable for this test.

A neon bulb 240 is placed across the common junction point of the current setting resistors 138–142 and the relay 100, with a 1 amp fuse 134 in series with the output. The neon bulb 240 will not conduct during normal operation of peak voltages of 60 volts but will conduct if an external voltage such as a power voltage is applied at the selected test point 30 or 34. When the neon bulb 240 is conducting, a high current will be passed through the fuse 134, which will open and protect the high level analog switches 178, 188, and 198 from possible damage.

The Oscillator Subsystem 92

Figure 6A:
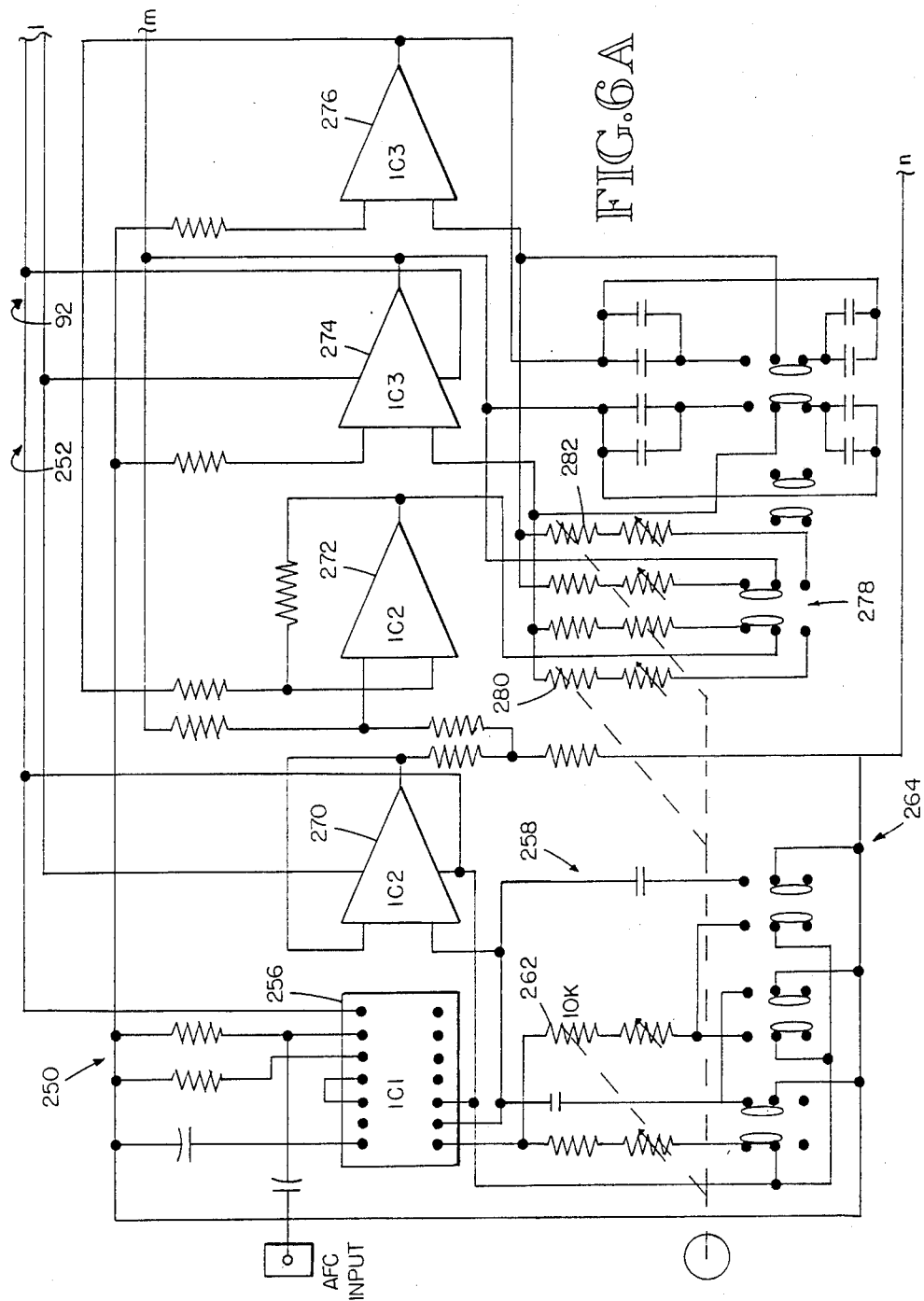
FIG. 6(A) is the first portion of a detailed circuit diagram of the oscillator subsystem shown in FIG. 2.
Figure 6B:
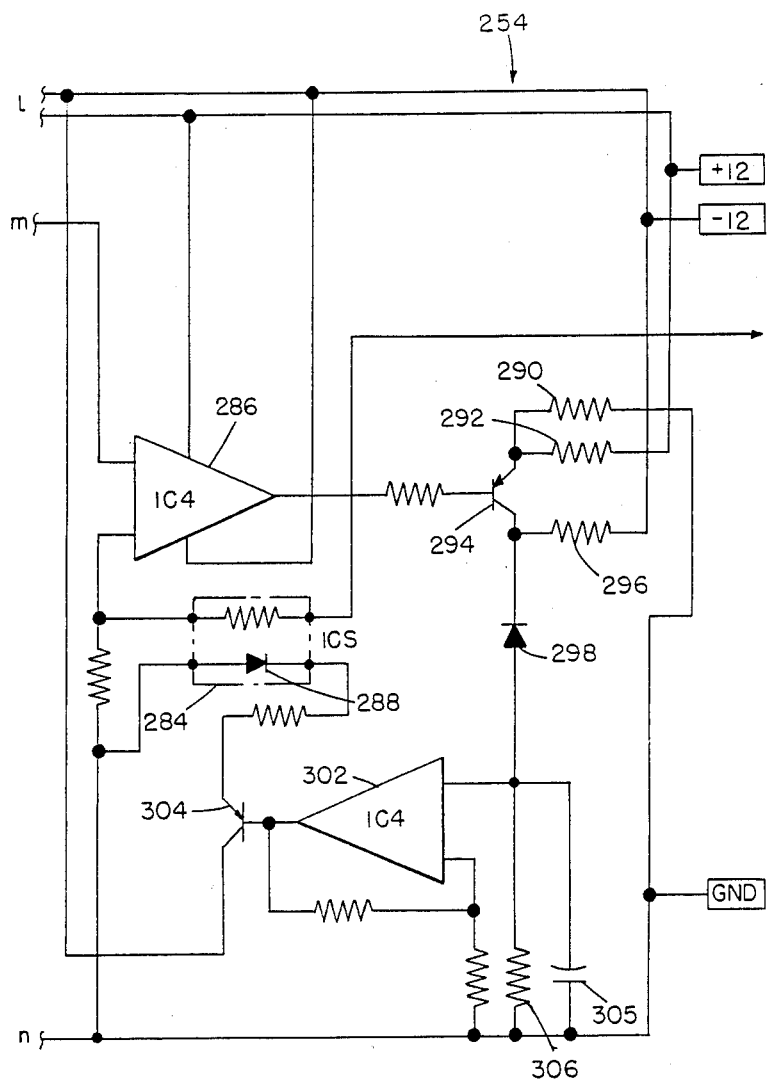
FIG. 6(B) is the second portion of detailed circuit diagram of the oscillator subsystem shown in FIG. 2.

Referring to FIGS. 6(A) and 6(B), it can be seen that the oscillator subsystem 92 is composed of three subsubsystems: a triangular wave generator subsystem 250, an active tunable harmonic filter subsystem 252, and an automatic gain control/output subsubsystem 254.

The triangular wave generator subsubsystem 250 is made from a "phase locked loop" chip 256 that is frequency tunable and generates a clean triangular wave. The frequency at which the chip 256 operates is determined by a resistance/capacitance network 258. Changing the frequency over a broad range can be accomplished by making the resistance of the network 258 variable. The control 44 includes 10 k ohm potentiometer 262 calibrated to change the frequency of the chip 256. The controls 38–42 include a ganged, three subsystem slide switch 264 which allows for selecting frequency ranges by changing the interconnections of the tuning capacitors or resistors of the network 258. Automatic frequency control of the chip is possible by injecting the control frequency at one of the pins of the chip 256. This control frequency is selectable from the front panel 12 of the test instrument 10 as either a multiple of the power line frequency or an external frequency generator other than the power line by operation of the AFC switch 46. The triangular wave output is fed to the active tunable harmonic filter subsubsystem 252.

The active tunable harmonic filter subsubsystem 252 uses four operational amplifier chips 270–276 with various biasing resistors and resistor/capacitor network 278 switched in for proper frequency. Two tuning resistors 280 and 282 are used in the resistor/capacitor network and are ganged to the tuning resistor 262 used in the triangular wave generator subsubsystem 250. This is done so that the filter center frequency will track the triangular wave frequency.

The triangular wave is a product of mostly odd harmonic sinusoidal waves. Elimination of the third and higher harmonic components produces essentially a fundamental sine wave. Since the magnitudes of the third and higher harmonic components are very low compared to the fundamental, it is possible to reduce them by passing the fundamental through the active turnable harmonic filter subsystem 252 which includes a narrow band pass filter. The output of the filter has approximately 0.5% harmonic distortion which is adequate for generating a test signal. The filter used is called a "state variable filter." The "Q" of the filter is set to approximately 5 which allows a 3 dB band-pass broad enough for filter tracking during the tuning process. Because the tuning resistors vary in value from one to the other, and over their resistance range, tracking is poor and the filter output can vary by a factor of as much as 2 to 1.

The automatic gain control subsubsystem 254 adjusts the output of the active turnable harmonic filter subsystem 252 to a constant 3.8 peak voltage (7.6 volts peak-peak). This circuit uses a photoresistor 284 in the gain setting network of an operational amplifier 286. The output gain of the operational amplifier 286 is determined by the value of the photoresistor 284. The value of the photoresistor 284 is determined by the current through a LED 288 comprising a part of the photoresistor 284.

The output gain of the operational amplifier 286 is initially set high enough so that the lowest level signal at its input will produce at least 3.8 volts peak at its output. A voltage divider composed of resistors 290 and 292 places +4.9 volts on the emitter of transistor 294. Base current will flow through transistor 294 as long as the voltage at the output of operational amplifier 286 is below approximately 3.8 to 3.85 volts. The collector current through transistor 294 will flow through resistor 296, brining the collector voltage to a positive level. When the output of the operational amplifier 286 rises above this value, the base current to transistor 294 is reduced and the collector of transistor 294 starts to fall below ground potential. This forward biases diode 298 and charges capacitor 300 at a negative level. The output of the operational amplifier 302 is at the same negative value. When this voltage is sufficiently negative transistor 304 conducts, turning on the photodiode LED 288. This reduces the resistance of the photoresistor 284, and the gain of the output operational amplifier 286 to the point where the feedback level is optimized. Resistor 306 discharges capacitor 300 and reduces the feedback time constant. The output remains constant to within a few millivolts, which is consistent with the needs of a set of standard test signals.

The Logic Subsystem 94

Figure 7A:
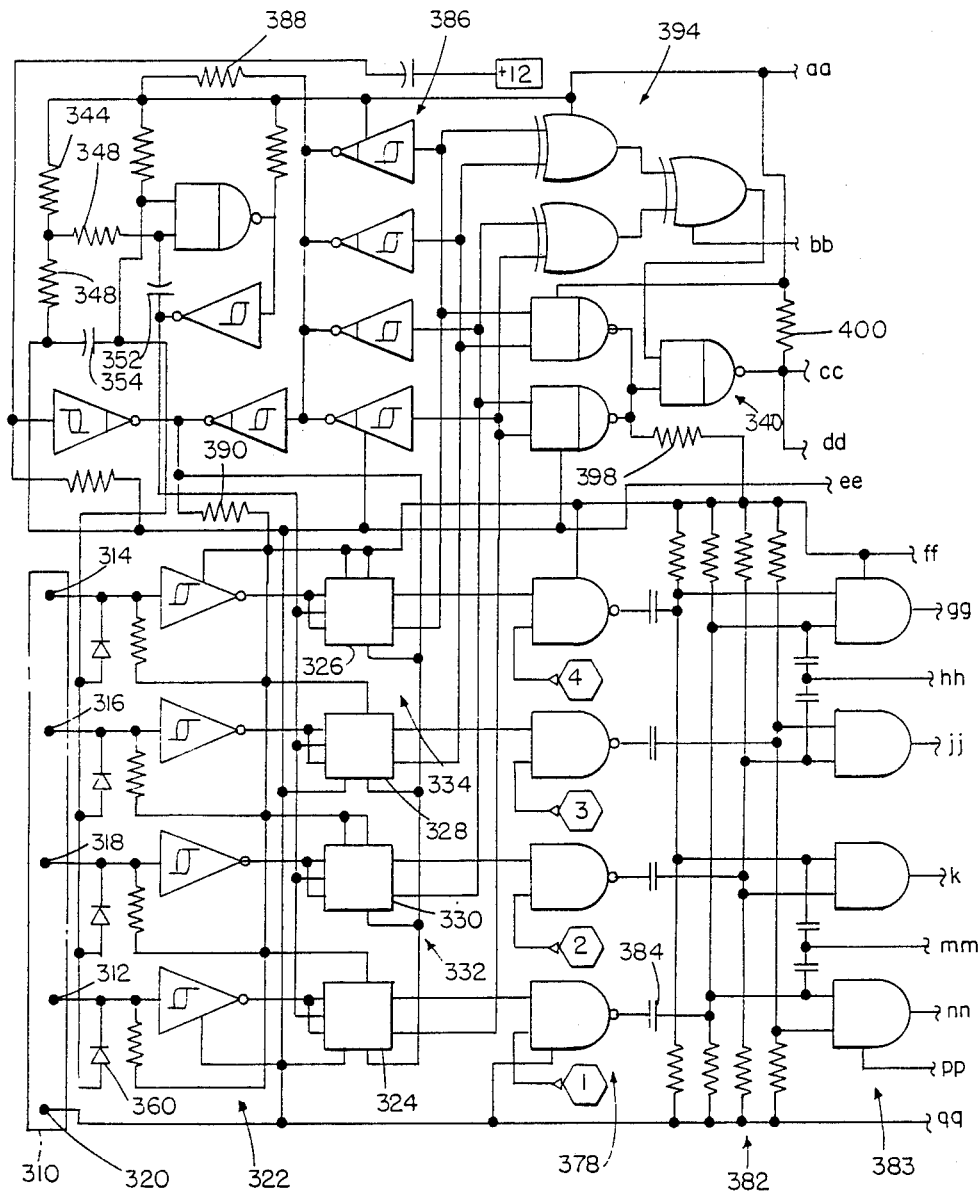
FIG. 7(A) is the first portion of a detailed circuit diagram of the logic subsystem shown in FIG. 2.
Figure 7B:
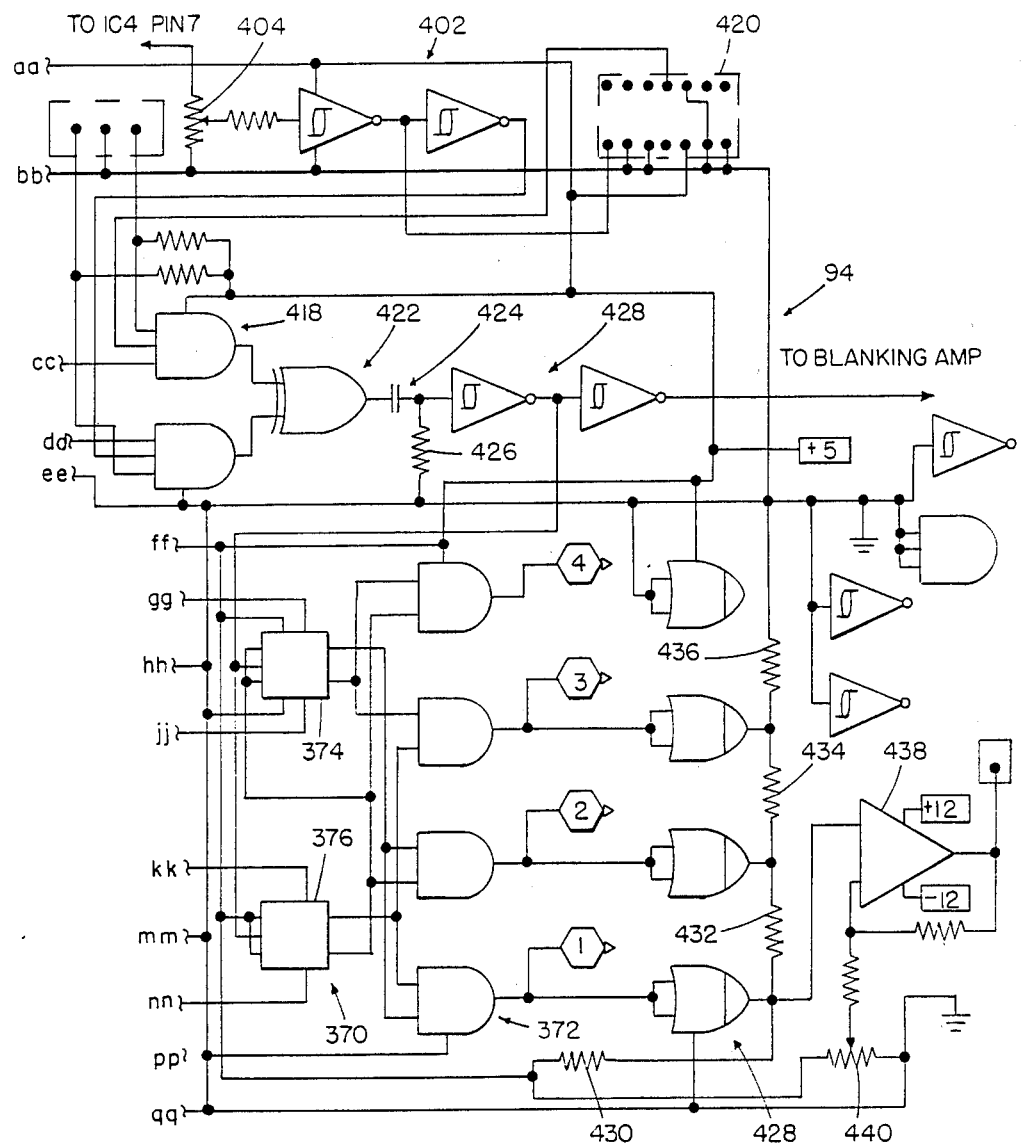
FIG. 7(B) is the second portion of a detailed circuit diagram of the logic subsystem shown in FIG. 2.

Referring to FIGS. 7(A) and 7(B), it can be seen that the logic subsystem 94 generates the four range signals that control the various functions in the generator subsystem 90 and the display subsystem 96. The following conditions are met in the logic subsystem 94:

1. The test range buttons 48–54 have intermittent contact bounce. This cannot affect the range selection process. "Debounce" circuitry must be used to eliminate the effects of contact bounce.
2. The clock that controls the logic subsystem 94 is created from the oscillator output sine wave.
3. The clock pulse is a +5 volt pulse.
4. The positive-going portion of the clock pulse must coincide with the positive-going peak of the oscillator sine wave.
5. On "power up," all range signals must be active.
6. There must always be at least one range signal active.
7. Pushing the test range button (on the front panel) for the last remaining active range signal will cause all range signals to be active.
8. When a range signal is deactivated it must not leave a time gap in the placement of the other range signal.
9. A "staircase" wave must be generated that proportions the "signatures" properly on the CRT of the display 16. The magnitude of the "staircase" wave must be continuously variable from zero to the maximum equal magnitude of positive or negative voltages.
10. It must be possible to adjust the point on the oscillator sine wave that triggers the clock pulse.

Debounce Circuitry:

The test range buttons 48–54, mounted on the front panel 12 and used to select the desired test condition, are connected to the logic subsystem 94 by connector 310. Test range buttons 48–54 are selectively connectable with contacts 312–318, respectively of the connector 310. Contact 320 of the connector is a ground return to the debounce circuitry. The test range buttons are single polesingle throw "push"-type switches.

When +5 volt power is applied to the logic subsystem 94, all four range signals are made active. Pushing one of the test range buttons 48–54 will cause two things to happen. First, a single negative-going transient pulse will be generated in a circuit 322 to all test range buttons, and second, the "J" and "K" inputs to the one flipflop among the flip-flops 324–330 that is connected to the test range button that was pushed, will go high. Each of the flip-flops 324–330 is connected to a respective one of the test range buttons 48–54.

The transient pulse that is generated is applied to the clock input of the four flip-flops 324–330. These flip-flops are referred to as the range inhibit flip-flops, and are contained in the integrated circuits 332 and 334. The transient pulse is generated in a circuit that eliminates the contact bounce from the test range buttons 48–54. This also causes a slight delay in the pulse, so that the "J" and "K" inputs to the flip-flop being triggered are high prior to the instant that the pulse appears. This mode causes the flip-flop to "toggle" from one state to the other. The power-up state of the flip-flop will cause the "Q" output of the flip-flop to go to a high state. Pushing the test range button again will cause the corresponding flip-flop to go to the low state, the range signal inhibit state. Repeated pushing of the test range button will cause the corresponding range inhibit flip-flop to toggle in and out of the inhibit state.

The debounce circuitry is composed of integrated circuit 322 and 340, resistors 342–350, and capacitors 352 and 354. The input contacts 312–318 will normally be at +5 volts. Assume that test range button 48 connected to contact 312 is pushed. Diode 360 is forward biased and the output of integrated circuit 322 goes to a low state, and a first input of integrated circuit 340 is brought to a low state and the output of integrated circuit 340 goes high. This brings capacitor 352 to a low state and a second input of the integrated circuit 340 to a low state. The charge across capacitor 352 will keep the second input of integrated circuit 340 at a low state for a period of time determined by the network time constant. This time constant is selected to remain until the initial contact bounce of the switch has stopped. The second input of the integrated circuit 340 will remain low and eliminate any effect that the switch voltage might have the first input of integrated circuit 340.

The pulse used to trigger the range inhibit flip-flops 324–330 is a single, clean pulse taken from the output of integrated circuit 322.

Contact bounce occurs on both the initial closing of the switch and on the opening of the switch. Closing contact bounce is eliminated by the filtering effects of capacitor 354.

Range Signal Generation:

The range signals are generated by a serial counter composed of two flip-flops 374 and 376 in the integrated circuit 370 and the four AND gates in the integrated circuit 372. The clock pulse that triggers the flip-flops 374 and 376 is generated from the oscillator sinusoidal waveform and occurs near the positive peak of each cycle. The exception to this is when the rate control 60, on the front panel 12, is in the "X-5" position. The clock pulse then occurs on each fifth oscillator sine wave. The clock pulse is a negative-going pulse.

Figure 8A:
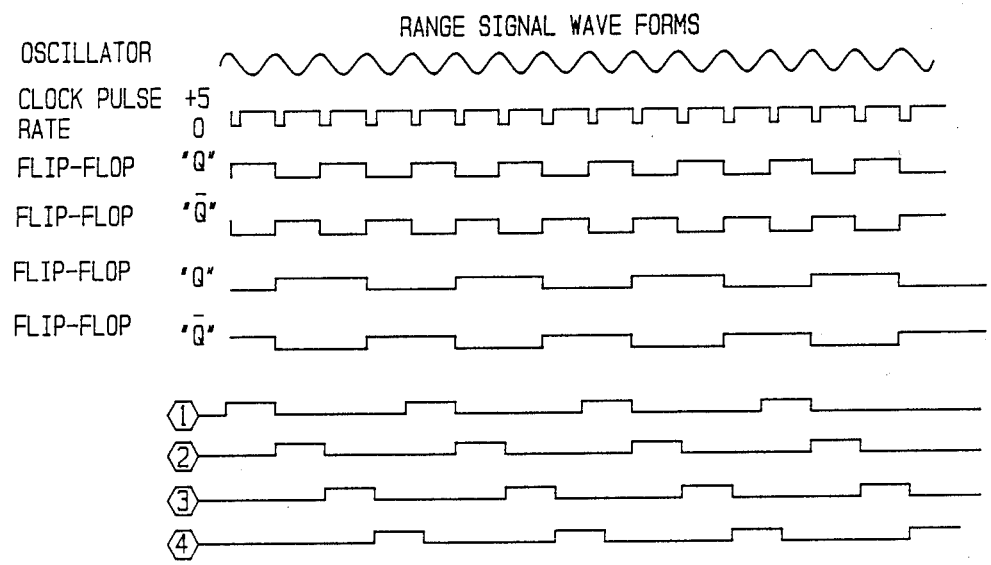
FIG. 8(A) is a time history of range signal waveforms provided by the test instrument of FIG. 1 when the instrument is operating under a first test condition.

FIG. 8(A) shows the range signal waveforms that will result when all range signals are active. All range inhibit flip-flops 324–330 will have their "Q" outputs high. This is the non-inhibit state, and the state that will result on initial power up. The rate control 60 is at a high state and a clock pulse will be generated for each oscillator cycle.

Figure 8B:
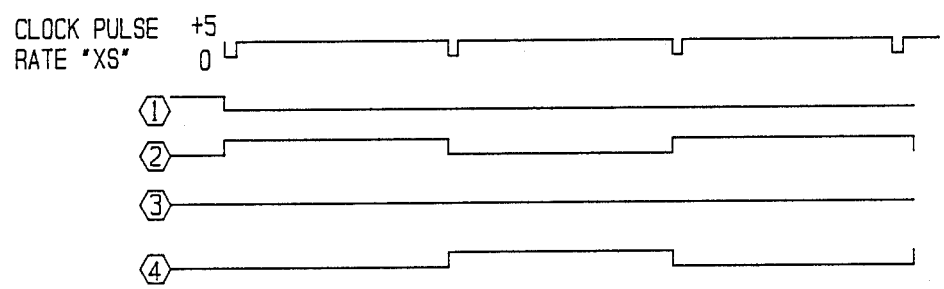
FIG. 8(B) is a time history of range signal waveforms provided by the test instrument of FIG. 1 when the instrument is operating under second test condition.

FIG. 8(B) shows the waveforms which result when the rate control 60 is at "X-5", with a clock pulse occurring at each 5th cycle of the oscillator output signal. Shown are the range signals that result when range inhibit flip-flops 324–330 are in the inhibit state, and the "Q-bar" outputs for the flip-flops 374 and 376 are high. There is no gap between the end of range signal 2 and the start of range signal 4.

Range signal 1 is in the high state when the "Q-bar" outputs of both flip-flops 374 and 376 are high. Range signal 2 is in the high state when the Q-bar output of flip-flop 374 and the "Q" output of flip-flop 376 are both in the high state. Range signal 3 is in the high state when the "Q" output of flip-flop 374 and the "Q-bar" output of flip-flop 376 are both in the high state. Range signal 4 is in the high state when the "Q" outputs of flip-flops 374 and 376 are both in the high state.

Range Inhibit Circuitry:

The four "JK" range inhibit flip-flops 324–330 on integrated circuits 332 and 334, the four NAND gates on integrated circuit 378, the four AND gates on integrated circuit 380 and the resistance/capacitance network 382 make up the range inhibit circuitry. The range inhibit process is one of selectively "setting" or "resetting" the appropriate one of the range inhibit flip-flops 324–330 to eliminate the range signal that is being inhibited.

As an example, assume that range signal 1 is being inhibited. Range inhibit flip-flop 324 is toggled to a "Q-bar" high state, and a first input of one NAND gate of the integrated circuit 378 is high. When range signal 1 goes high because of normal range inhibit action, a second input of the NAND gate goes high and the NAND gate output goes low.

The four AND gates of integrated circuit 380 have all inputs at approximately +3 volts, which is sufficient to activate each AND gate input so that each output is high.

When the NAND gate output of integrated circuit 378 goes low, two inputs of the AND gates of integrated circuit 380 go low with the transient pulse through capacitor 384 and the outputs of these two AND gates go low. The output of the one AND gate of integrated circuit 380 is connected to the set input of flip-flop 376 and the negative pulse sets flip-flop 376 so that its "Q" output is high. The output of the other AND gate of integrated circuit 380 is connected to flip-flop 374 so that its "Q" output is low. This condition now has the inputs to two of the AND gates of integrated circuit 372 in the high state and the output is the range signal 1 which is high.

In reality, range signal 1 actually goes high for a period of less than 80 nanoseconds, which is the time that it takes to reset the flip-flop 324. Since this represents an extremely small "on" time compared to the time the range signal is in the high state, the transient pulse has no effect on the control of the generator subsystem 90 or the display subsystem 96, with the result that it appears to be totally missing. FIG. 9(A) shows the waveforms that result from this action.

In a second example, FIG. 9(B) shows a condition in which range signals 1 and 2 are inhibited and range signals 3 and 4 are active. The waveform activity at the beginning of range signals 1 and 2, as shown in FIG. 9(A), are greatly exaggerated. In normal display, operation of display 16 would not be noticeable.

All Range Circuitry:

Five logic inverters from integrated circuit 386, with resistors 388 and 390 form this circuitry. The all range circuitry activates all four range signals, when only one range signal is present and the operator activates the selected flip-flop of the range signal inhibit flip-flops 324–330. For example, suppose range signals 1, 2 and 3 have been turned off by the inhibit flip-flops and range signal 4 is on. If test range button 54 corresponding to range signal 4 is pushed, the inhibit flip-flop for range 4 would be activated and all four range inhibit flip-flops would then be activated.

This condition creates a problem for the logic subsystem 94. To prevent this problem all four of the inhibit flip-flop "Q" outputs are fed to four logic inverts of integrated circuit 386 which have all four of its outputs tied together. When all four of the "Q" outputs go low, the tied output of the four logic inverters goes high, and is provided to another logic inverter 392, which has its output connected to the "set" input of the four inhibit flip-flops and causes the "set" inputs to go low. This sets the "Q" outputs to a high state and turns off all inhibit signals on the "Q-bar" outputs. As a result, all range signals are active.

Clock Lockout Circuitry:

A third example exists where three range signals are inhibited. In this mode the oscillator output signal to the logic subsystem 94 is turned off and the inhibit flip-flops 324–330 remain in a steady state condition that activates the desired range signal.

The clock lockout circuitry is composed of integrated circuits 394 and 340 and resistors 398 and 400.

Figure 10:
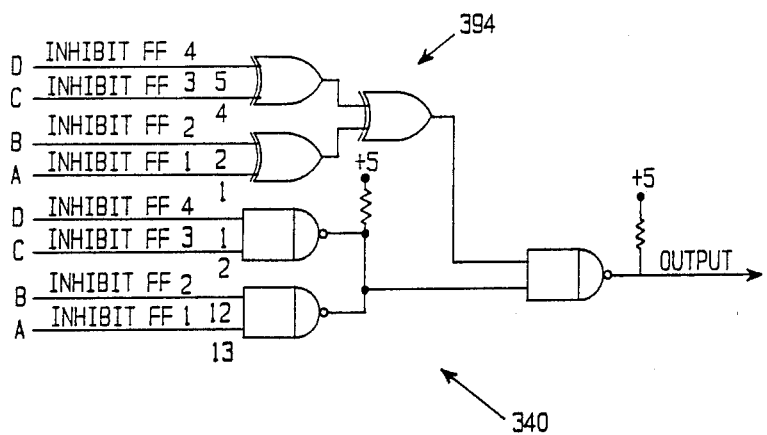
FIG. 10 is a truth table for the clock lockout circuitry of the test instrument of FIG. 1.

FIG. 10 is a schematic presentation of this arrangement. This circuitry senses the four inhibit flip-flop "Q" outputs and determines if three of these flip-flops have been activated. An inactive inhibit flip-flop will have its "Q" output at a high state. If three of the inhibit flip-flops have been activated, the output of this circuitry goes low and turns off the clock pulses.

The "Q" outputs of inhibit flip-flops 324 and 330 are input to the inputs of a first exclusive OR gate of integrated circuit 394 and also to the inputs of a first NAND gate of integrated circuit 340. Inhibit flip-flops 326 and 326 have their "Q" outputs connected to that input of a second exclusive OR gate of integrated circuit 394 and also to the inputs of a second NAND gate of integrated circuit 340. The outputs of the two exclusive OR gates go to the inputs of a third exclusive gate of integrated circuit 394. The outputs of both NAND gates are tied together and then to an input of a third NAND gate on integrated circuit 340. Also, the output of the third exclusive OR gate is connected to the other input of the third NAND gate on integrated circuit 340.

The third NAND gate of integrated circuit 340 must have a high output for the clock pulses to pass to the logic subsystem 94. If both inputs to this third NAND gate are high, the output will be low and clock pulses will be gated off. The truth table for this arrangement is shown in FIG. 10, with the conditions for gating off the clock pulse.

Times 1-Times 5 Circuitry, Clock Forming And Blanking Pulse Circuitry:

A square wave is formed from the oscillator output signal by amplifying in a logic inverter 402. A 25 turn trimpot 404 adjusts the inverter turn-off point, near the peak of the positive going sine wave output signal from the oscillator. Two square wave signals are generated: one is fed directly to a three input AND gate on integrated circuit 418 and the other is fed to a counter chip, integrated circuit 420, whose divide by five output is fed to another three input AND gate on the integrated circuit 418.

Each of the three input AND gates is fed by the output of integrated circuit 340 of the clock lockout circuitry. The spread control 56 on the front panel 12 can activate either one of the two AND gates. The spread control 56 grounds one of the inputs to one of the AND gates and allows one of the inputs on the other gate to go to +5 volts. This arrangement effectively allows control of the passage of a square wave for each cycle of the oscillator output signal or a square wave for each group of five oscillator cycles.

Each of the three input AND gates of integrated circuit 418 feeds one of two inputs if a two input exclusive OR gate on integrated circuit 422. The output of integrated circuit 422 passes through a capacitor 424 and resistor 426 to the input of a logic inverter found on integrated circuit 428. The transient that is formed by the combination of resistor 426 and capacitor 424 is a negative-going pulse that clocks the flip-flops 374 and 376.

An additional positive-going pulse is formed for the blanking amplifier, a conventional component not shown in FIG. 7. Capacitor 424 and resistor 426 determine the width of the clock pulse and blanking pulse. The width of the clock pulse is not critical, but the width of the blanking pulse is critical.

Staircase Generator Circuitry:

Range signals 1, 2 and 3 are fed to three open collector logic OR gates on integrated circuit 428 which are used as drivers. Each logic driver grounds a subsystem of a voltage divider composed of resistors 430–436 as each range signal comes on. This creates a staircase voltage at the common divider mode of resistors 430 and 432. This staircase voltage has its lowest voltage level of zero volts when range signal 1 is on. Each logic driver causes a different voltage to be at the divider node.

Figure 11:
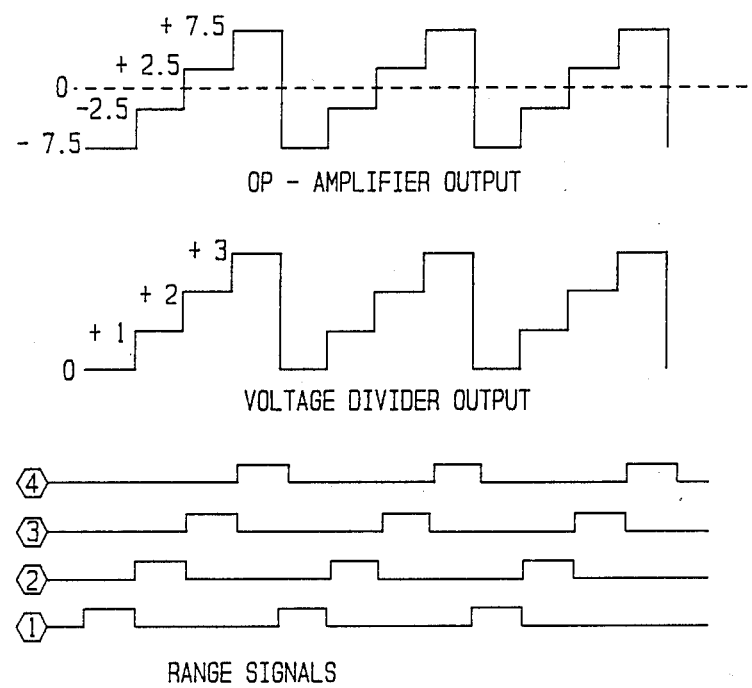
FIG. 11 is a time history of the staircase waveforms provided by the test instrument of FIG. 1.

The voltage at the divider node feeds on an operational amplifier 438, which has its output referenced in such a way that the staircase wave is centered at zero volts and has equal magnitudes of positive and negative voltages. The voltage center is adjusted by trimpot resistance 440. The output of operational amplifier 438 is fed to a front panel control potentiometer (not shown) that feeds this signal to the conventional vertical deflection amplifier (discussed subsequently as the vertical amplifier system 450). Examples of the staircase waveforms are shown in FIG. 11.

Display Device Subsystem 96

Figure 12A:
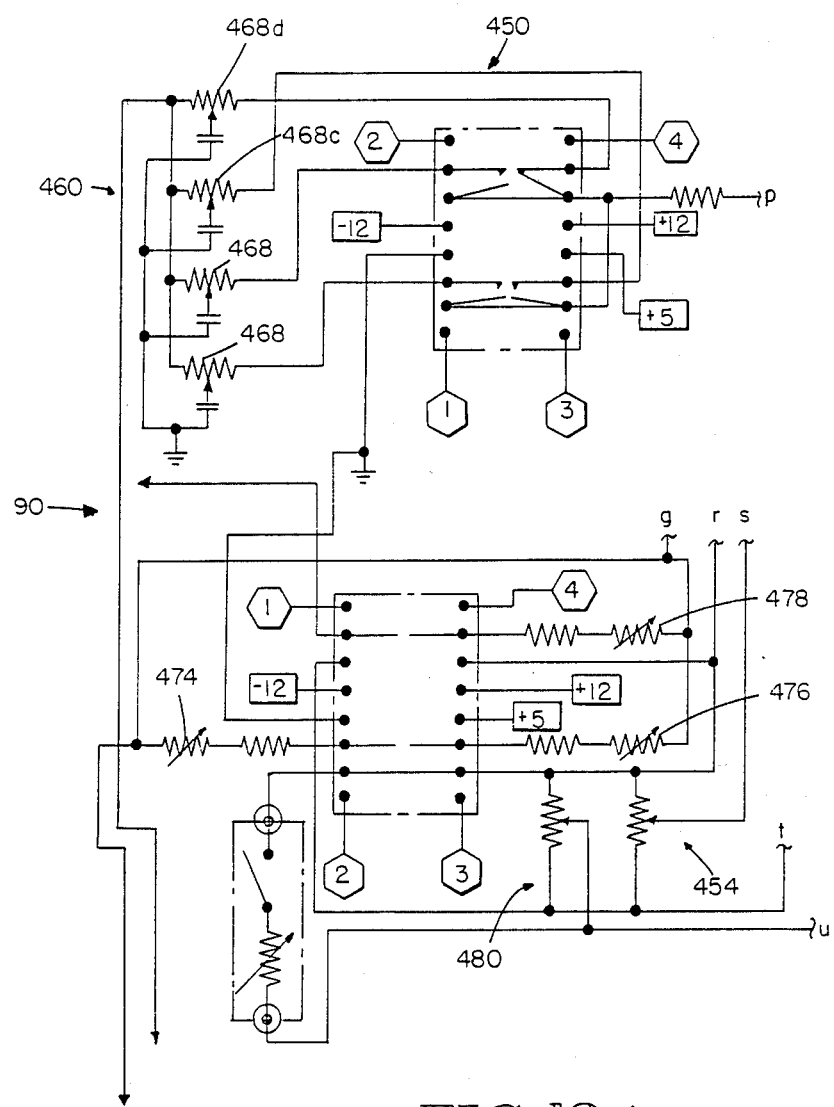
FIG. 12(A) is the first portion of a detailed circuit diagram of the display device subsystem of FIG. 2.
Figure 12B:
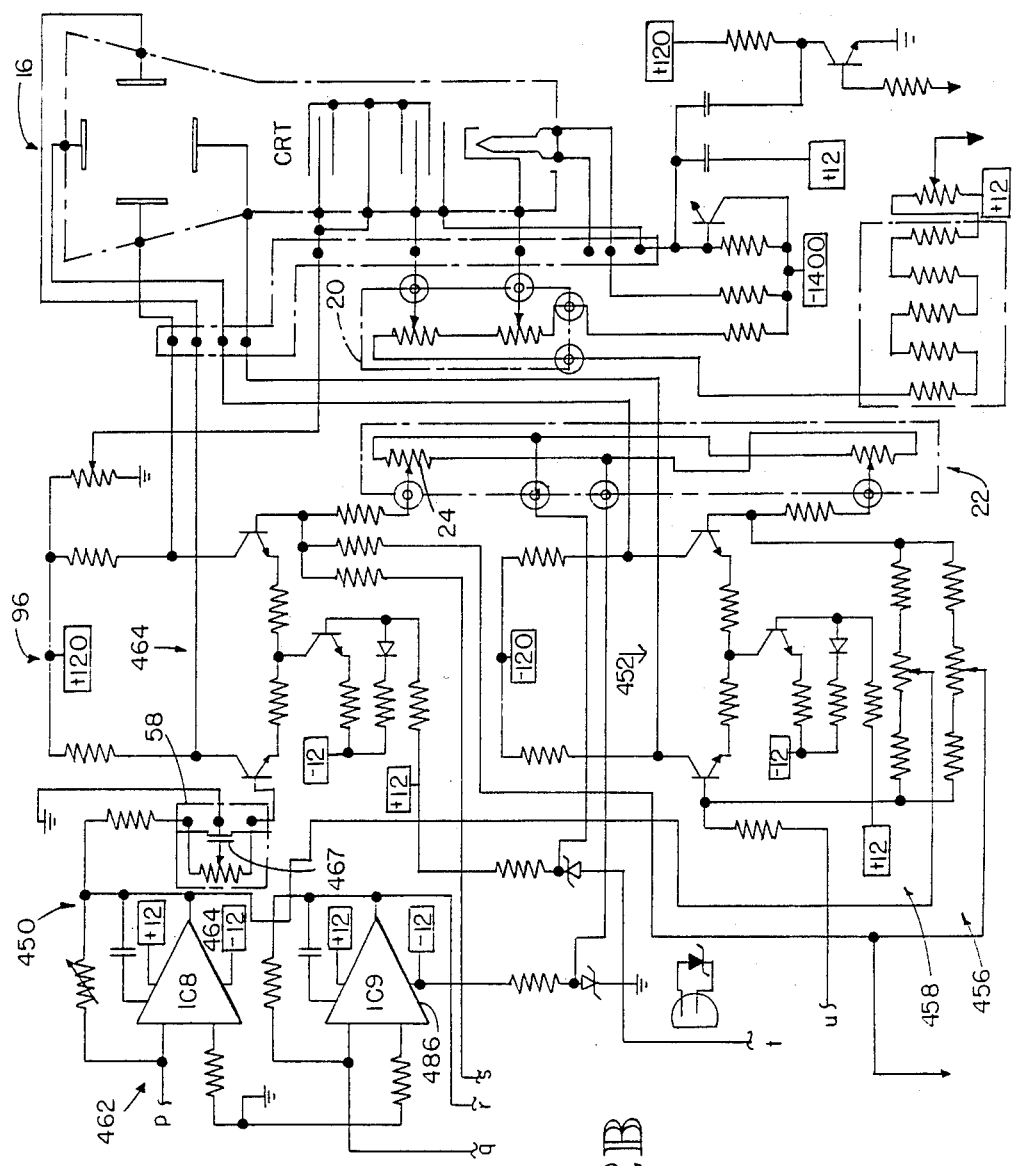
FIG. 12(B) is the second portion of a detailed circuit diagram of the display device subsystem of FIG. 2.

As shown in FIGS. 12(A) and 12(B), the display subsystem 96 has two inputs from the generator subsystem 90. One input feeds the vertical amplifier system 450 and the other feeds the horizontal amplifier system 452. A third input voltage, from the logic subsystem 94, provides vertical displacement on the CRT display 16 for each "signature" of the device(s) under test. There are four outputs from the logic subsystem 94. These supply horizontal and vertical deflection voltages for the CRT display.

Various correction voltages are injected at the inputs of both amplifiers systems 450 and 452 to correct for variations in the cathode ray tube used. The correction voltages are provided by horizontal tilt correction circuitry 454, vertical tilt correction circuitry 456, and vertical short correction circuitry 458.

Horizontal and vertical controls 22 and 24 are provided for front panel, operator control.

Vertical Amplifier System:

The vertical amplifier system 450 is fed the oscillator output signal and provides a "standard" for the current sensing across the current setting resistors 126 and 138–142 in the generator subsystem 90.

The vertical amplifier system 450 consists of the vertical phase set circuitry 460, the low level vertical amplifier 462, the front panel phase control 58, and the vertical deflection amplifier 464.

The vertical phase set circuitry 460 corrects for parasitic phase shifts in the horizontal amplifier system 452 due to the various gains that are necessary in the low level horizontal amplifier 466. A phase shift through the low level horizontal amplifier 466 will result in the test signal having a false quadrature phase component, unless an identical phase is introduced into the vertical amplifier system 450. This will result in a distorted signature being displayed for the electronic device under test.

The low level vertical amplifier 462 is an operational amplifier chip and has a gain of less than unity. Its main purpose is for impedance transfer. The vertical trace on the CRT display 16 is set by adjusting the gain of this amplifier.

Figure 13:
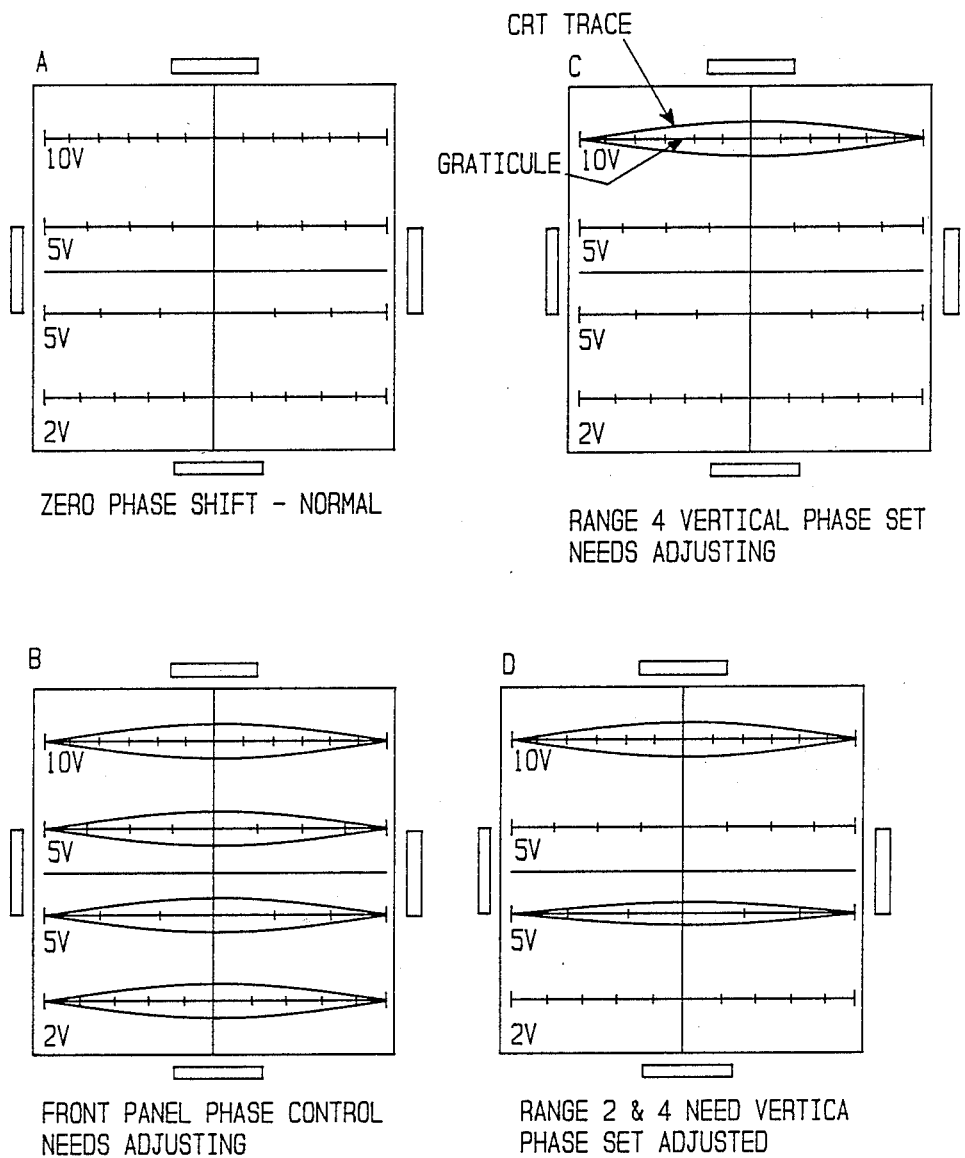
FIG. 13 is a pictorial presentation of typical waveforms provided by the test instrument of FIG. 1 when adjusting the phase shift between the horizontal and vertical amplifiers of the test instrument.

A phase shift network, made from resistor 465 and capacitor 467, is mounted on the front panel 12 of the test instrument 10 and can be adjusted by the operator turning phase control 58 to correct for test lead capacity. The phase control 58 is normally set to position resistor 465 at its center position prior to calibration of the vertical phase set circuitry 460. Calibration is made with the front panel test points 28, 30 and 34 open, no test leads attached, and the test frequency set at 5000 Hz. Calibration can be made while all range signals are active by observing the respective CRT display horizontal trace and adjusting the vertical phase set circuitry range trimpot 468. Calibration is completed when all traces have zero split. A straight horizontal line without a split indicates zero phase angle between the vertical and horizontal amplifier systems 450 and 452. FIG. 13 shows these relationships.

The output of the phase shift network drives the vertical amplifier system 464. This amplifier is a differential type, with the second input driven by three source voltages.

One source voltage is from the vertical position control 24, mounted on the front panel 12. This is an operator control and sets the vertical position of the CRT display trace.

Another source voltage is from the operational amplifier 438 of the logic subsystem staircase generator circuitry (see FIG. 7). This waveform deflects the CRT trace vertically, in steps, to position each signature properly.

A third source voltage is from the output of the horizontal tilt correction circuitry 454 and corrects for undesirable tilt on the horizontal trace. If the cathode ray tube display being used was a perfect tube and the test points 28, 30 and 34 were open (i.e., no test leads or device under test connected), the voltage injected at the second vertical amplifier input of the vertical amplifier system 450 would exactly equal the voltage from the low level vertical amplifier 462 that is injected at the first vertical amplifier input. In practice, these two voltages are of equal amplitude and exactly in phase since their phase has been corrected in the vertical phase set circuitry 460.

If the cathode ray tube has some built-in tilt, which is most probable, the tilt correction voltage will be adjusted, either higher or lower than the first vertical input voltage, for proper correction.

The vertical amplifier system 450 provides drive voltages to the vertical deflection plates of the CRT display 16.

The Horizontal Amplifier System:

During an open test point condition, when a device is not being tested, the voltages as shown in FIG. 8(A) will be input to the horizontal amplifier system 452. The amplified level of these voltages must be adjusted so that they all have the same amplitude level out of the low level horizontal amplifier 466. In other words, range signature 1 must be the same amplitude as range signature 4. The output of the low level horizontal amplifier 470 will be a sine wave.

This gain adjustment is accomplished by changing the gain of the low level horizontal amplifier 466 for each range signature. During an open test point condition, there will be zero vertical deflection and maximum horizontal deflection so that a straight, horizontal line appears on the CRT display 16 for each signature.

The gain of the amplifier during range signal 1 is 0.766. Since the test signal is 20 volts peak-peak for range 1 the amplifier output will be 15.3 volts peak-peak.

Test signal 2 is 30 volts peak-peak. The amplifier will have a gain of 0.510 and an output of 15.3 volts peak-peak.

Test signal 3 is 40 volts peak-peak. The amplifier will have a gain of 0.383 and an output of 15.3 volts peak-peak.

Test signal 4 is 120 volts peak-peak. The amplifier will have a gain of 0.128 and an output of 15.3 volts peak-peak.

Each gain will be determined by the respective range signal, the low level analog switch IC7 and the gain adjust resistor for the particular range signal. Range signal 2, 3 and 4 gain adjust resistors 474–478 are in parallel with range signal 1 resistor 472 which is fixed.

The output of the low level horizontal amplifier 470 feeds one input of the horizontal amplifier system 452 and one input of the vertical amplifier system 450 (described earlier). The horizontal width of the CRT traces are adjusted with the master horizontal gain 480.

The output from the low level vertical amplifier 462 is fed to a resistor network that divides the signal injection to the inputs of the horizontal amplifier system 452. This signal corrects for vertical tilt on the CRT trace during a shorted test point condition.

The output of the amplifier 438 of the staircase generator circuitry (see FIG. 7) is also fed to a similar network for vertical tilt correction 456.

The Power Supply Subsystem 98

Figure 14:
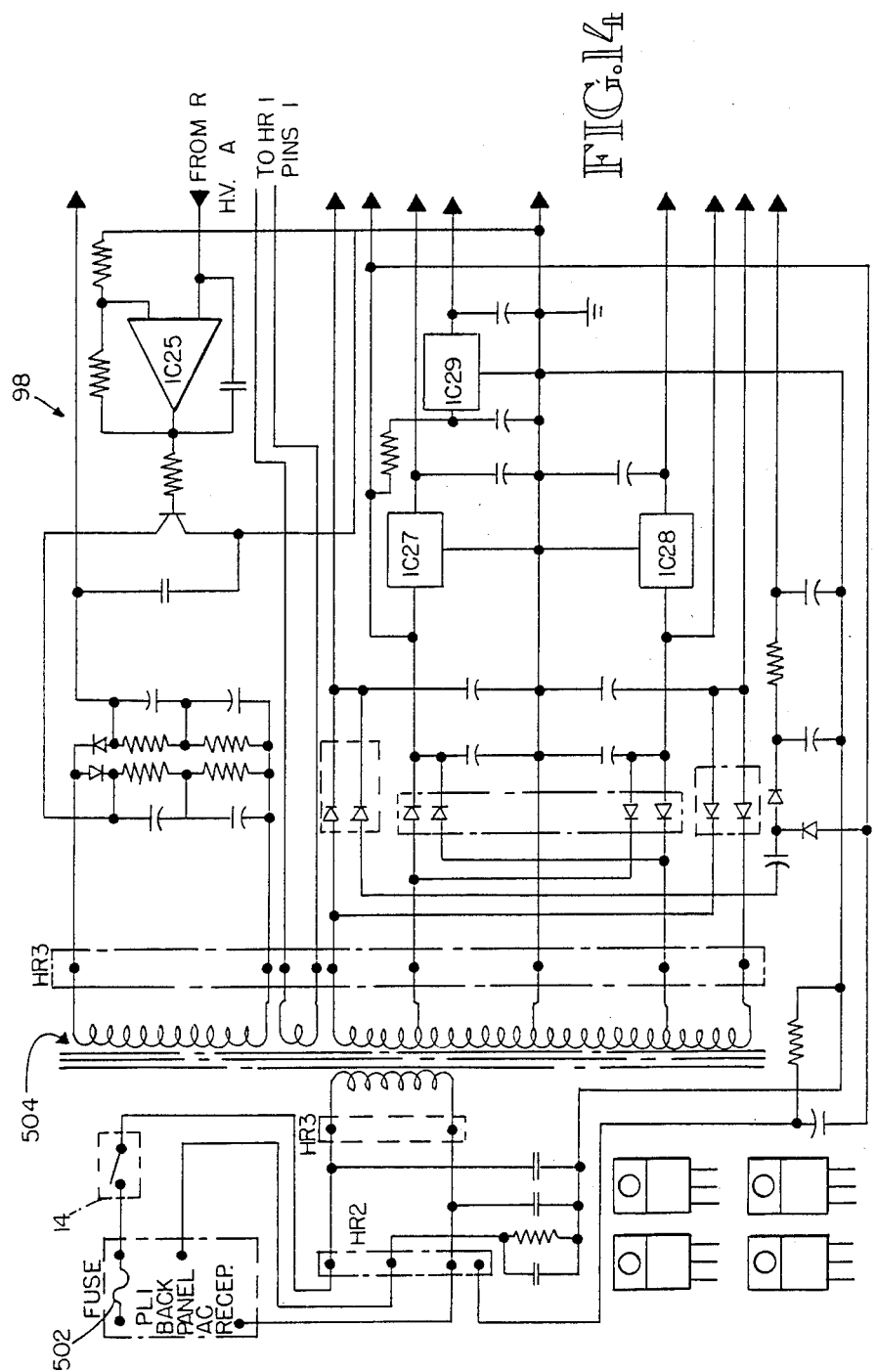
FIG. 14 is a detailed circuit diagram of the power supply subsystem shown in FIG. 2.

As shown in FIG. 14, the power supply subsystem 98 consists of conventional circuitry to provide the voltages required by the other subsystem 90–96 of the test instrument 10.

The AC line voltage is received through a back-panel receptacle 500, which incorporates a fuse 502. Upon activation of the power switch 14, the AC line voltage is transformed by the transformer 504, to produce various AC voltages. These AC voltages pass to conventional shaping circuits and integrated circuits to generate the various output voltages needed.

While the foregoing detailed description of the test instrument of the invention has been given in terms of the best mode presently contemplated, one skilled in the art will readily appreciate that various modifications of the above-described embodiment may be made without departing from the spirit and the scope of the invention. Accordingly, the spirit and the scope of the present invention are to be limited only by the following claims.

I claim:

1. An apparatus for testing an electronic device, comprising:
   means for selecting a plurality of conditions under which the electronic device is to be tested;
   means for generating an analog input signal corresponding to said selected plurality of test conditions;
   means for applying said input signal to the electronic device to produce a corresponding response of the electronic device and generating a pair of related horizontal and vertical analog output signals indicative of said response;
   means for producing a plurality of pairs of related horizontal and vertical analog signature signals from said pair of related horizontal and vertical analog output signals, concurrently with the generation of said pair of related horizontal and vertical analog output signals, one pair of said related horizontal and vertical signals of said plurality of pairs of related horizontal and vertical signature signals corresponding to each of said selected plurality of test conditions; and
   means for simultaneously displaying said plurality of pairs of related horizontal and vertical analog signature signals.

2. The apparatus of claim 1 wherein said analog input signal comprises periodic repetitions of a plurality of analog signal segments, said plurality of signal segments corresponding to said plurality of selected test conditions.

3. The apparatus of claim 2 wherein each of said plurality of analog signature signals comprises a pair of analog signature signal segments, each said pair of analog signature signal segments corresponding to one of said plurality of selected test conditions.

4. The apparatus of claim 1 wherein one signal in each of said plurality of pairs of related horizontal and vertical analog signature signals represents the voltage across the electronic device and the other signal in each of said plurality of pairs of related horizontal and vertical analog signature signals represents the current conducted by the electronic device.

5. The apparatus of claim 4 wherein said means for simultaneously displaying said plurality of pairs of related horizontal and vertical analog signature signals has memory, so that signals that are received sequentially as displayed simultaneously.

6. The apparatus of claim 5 wherein said means for displaying said plurality of pairs of related horizontal and vertical analog signature signals simultaneously is a cathode ray tube display.

7. The apparatus of claim 6 wherein each of said plurality of pairs of related horizontal and vertical analog signature signals is displayed in a distinct reference system, the placement of each of said plurality of pairs of related horizontal and vertical analog signature signals on said cathode ray tube display being adjustable.

8. The apparatus of claim 7 wherein said distinct reference system for each of said plurality of pairs of related horizontal and vertical analog signature signals can be adjusted into coincidence.

9. The apparatus of claim 1 wherein said means for generating an analog input signal includes means for concurrently generating a plurality of analog input signals corresponding to said selected plurality of conditions, said means for applying said input signal to the electronic device includes means for switching among said plurality of analog input signals to sequentially provide each of said plurality of analog input signals to the electronic device, the apparatus further comprising means for sequentially providing said plurality of said signatures to said display means, whereby said display means simultaneously displays said plurality of signatures.

10. An apparatus for testing an electronic device, comprising:

means for selecting a plurality of conditions under which the electronic device is to be tested;

means for generating an analog input signal corresponding to said selected plurality of test conditions comprising a switch means that selects a plurality of selectable amplifiers, each selectable amplifier producing a sinusoidal voltage having a distinct predetermined peak value and being capable of supplying a distinct predetermined maximum current, said plurality of selectable amplifiers operating at a substantially constant predetermined frequency;

means for applying said input signal to the electronic device to produce a corresponding response of the electronic device and generating a pair of analog output signals indicative of said response;

means for producing a plurality of pairs of analog signature signals from said pair of output signals, concurrently with the generation of said pair of output signals, one of said pairs of signature signals corresponding to each of said selected plurality of test conditions; and means for simultaneously displaying said plurality of pairs of signature signals.

11. The apparatus of claim 10 wherein said switch means further contains selectable voltage divider means attached to said plurality of selectable amplifiers, said voltage divider means reducing the voltage across the electronic device from the predetermined peak value.

12. The apparatus of claim 10, further comprising means for continuously adjusting the predetermined frequency of said plurality of selectable amplifiers.

13. The apparatus of claim 10 wherein said analog input signal comprises periodic repetitions of segments of the sinusoidal voltages produced by said selectable amplifiers-that have been selected by said means for selecting test conditions, said signal segments comprising a predetermined number of cycles of said sinusoidal voltages operating at said substantially constant predetermined frequency.

14. The apparatus of claim 13, further comprising means for selecting said predetermined number of cycles of said sinusoidal voltages from predetermined values.

15. An apparatus for testing an electronic device, comprising:

means for selecting a plurality of conditions under which the electronic device is to be tested;

means for generating an analog input signal corresponding to said selected plurality of test conditions comprising a switch means that switches periodically among a plurality of analog signal segments and synchronously supplies the analog signal segments to compose the analog input signal;

means for applying said input signal to the electronic device to produce a corresponding response of the electronic device and generating a pair of analog output signals indicative of said response;

means for producing a plurality of pairs of analog signature signals from said pair of output signals, concurrently with the generation of said pair of output signals, one of said pairs of signature signals corresponding to each of said selected plurality of test conditions; and means for simultaneously displaying said plurality of pairs of signature signals.

16. The apparatus of claim 15 wherein each of said plurality of analog signal segments contains substantially the same frequency.

17. An apparatus for testing an electronic device, comprising:

means for sequentially selecting first and then second pluralities of conditions under which the electronic device is to be tested;

means for sequentially generating first and then second analog input signals, said first and second input signals respectively corresponding to said first and second pluralities of selected test conditions;

means for sequentially applying said first and then said second input signals to the electronic device to produce corresponding first and second analog responses of the electronic device and respectively generating first and second pairs of related horizontal and vertical analog output signals respectively indicative of said first and second responses;

means for sequentially producing a first plurality of first pairs of related horizontal and vertical analog signature signals from said first pair of related horizontal and vertical analog output signals concurrently with the generation of said first pair of related horizontal and vertical analog output signals and then a second plurality of second pairs of related horizontal and vertical signature signals from said second pair of related horizontal and vertical analog output signals concurrently with the generation of said second pair of related horizontal and vertical analog output signals, said first plurality of first pairs of related horizontal and vertical analog signature signals corresponding to said first plurality of selected test conditions and said second plurality of second pairs of related horizontal and vertical analog signature signals corresponding to said second plurality of selected test conditions;

means for periodically sampling said first plurality of first pairs of related horizontal and vertical analog signature signals and producing digital signals;

memory means for storing said digital signals;

means for retrieving said stored digital signals from said memory means for producing a reconstructed first plurality of first pairs of related horizontal and vertical analog signature signals; and means for simultaneously displaying said reconstructed first plurality of first pairs of related horizontal and vertical analog signature signals and said second plurality of second pairs of related horizontal and vertical analog signature signals.

18. The apparatus of claim 17 wherein one signal in each of said first and second pluralities of pairs of related horizontal and vertical analog signature signals represents the voltage across the electronic device and the other signal in each of said first and second pluralities of pairs of related horizontal and vertical analog signature signals represents the current conducted by the electronic device.

19. An apparatus for comparing two electronic devices, comprising:

means for selecting a plurality of conditions under which the two electronic devices are to be compared;

means for generating an input signal corresponding to said plurality of selected comparison conditions;

means for alternately applying said input signal to the two electronic devices to alternately produce a corresponding response of each of the two electronic devices and alternately generating corresponding pairs of output signals indicative of said corresponding response;

means for alternately producing a plurality of pairs of related horizontal and vertical analog signature signals from said pairs of output signals for each of the devices concurrently with the generation of said pairs of output signals, one of said plurality of pairs of related horizontal and vertical analog signature signals corresponding to each of said selected comparison conditions; and means for alternately displaying said plurality of pairs of related horizontal and vertical analog signature signals for each of the devices, said plurality of related horizontal and vertical analog signature signals for each of the devices being simultaneously displayed.

20. An apparatus for comparing two electronic devices, comprising:

means for selecting a plurality of conditions under which the two electronic devices are to be compared;

means for generating an analog input signal corresponding to said plurality of selected comparison conditions comprising a switch means that switches periodically among a plurality of analog signal segments and synchronously supplies the plurality of analog signal segments to compose the analog input signal;

means for alternately applying said analog input signal to the two electronic devices to alternately produce a corresponding response of each of the two electronic devices and alternately generating corresponding pairs of output signals indicative of said corresponding response;

means for alternately producing a plurality of pairs of signature signals from said pairs of output signals for each of the devices concurrently with the generation of said pairs of output signals, one of said plurality of pairs of signature signals corresponding to each of said selected comparison conditions; and means for alternately displaying said plurality of pairs of signature signals for each of the devices, said plurality of signature signals for each of the devices being simultaneously displayed.

21. An apparatus for testing an electronic device, comprising:

a switch having a plurality of selectable states, each state corresponding to one of a plurality of conditions under which the electronic device is to be tested;

a signal generator connected to said switch for generating an analog input signal corresponding to said selected plurality of test conditions;

a first electronic circuit for applying said input signal to the electronic device to produce a corresponding response of the electronic device and generating a pair of related horizontal and vertical analog output signals indicative of said response;

a second electronic circuit for receiving said pair of related horizontal and vertical analog output signals from said first electronic circuit and to produce a plurality of pairs of related horizontal and vertical analog signature signals concurrently with the generation of said pair of related horizontal and vertical output signals, one of said pairs of related horizontal and vertical analog signature signals corresponding to each of said selected plurality of test conditions; and an analog visual display for simultaneously displaying said plurality of pairs of related horizontal and vertical analog signature signals.

22. An apparatus for testing an electronic device, comprising:

a switch having a plurality of selectable states, each state corresponding to one of a plurality of conditions under which the electronic device is to be tested;

a signal generator connected to said switch for generating an analog input signal corresponding to said selected plurality of test conditions by sequentially switching among a plurality of selectable amplifiers, each selectable amplifier producing a sinusoidal voltage having a distinct predetermined peak value and being capable of supplying a distinct predetermined maximum current, said plurality of selectable amplifiers operating at a substantially constant predetermined frequency;

a first electronic circuit for applying said analog input signal to the electronic device to produce a corresponding response of the electronic device and generating a pair of analog output signals indicative of said response;

a second electronic circuit for receiving said pair of analog output signals from said first electronic circuit and to produce a plurality of pairs of analog signature signals concurrently with the generation of said pair of analog output signals, one of said pairs of analog signature signals corresponding to each of said selected plurality of test conditions; and an analog visual display for simultaneously displaying said plurality of pairs of analog signature signals.

23. The apparatus of claim 22, wherein said plurality of selectable amplifiers produces any selected frequency within a predetermined continuous range of frequencies, and further comprising a continuous frequency adjustment connected to said plurality of selectable amplifiers, whereby the apparatus is adjustable to apply the selected test conditions to the electronic devices at any substantially constant frequency in said predetermined continuous range of frequencies.

24. An apparatus for testing an electronic device, comprising:

a sequential switch having a plurality of selectable states, said sequential switch being adapted to sequentially select first and then second pluralities of conditions under which the electronic device is to be tested;

a signal generator connected to said sequential switch and for sequentially generating first and then second analog input signals, said first and second analog input signals respectively corresponding to said first and second pluralities of selected test conditions;

a first electronic circuit for sequentially applying said first and then said second analog input signals to the electronic device to produce corresponding first and second analog responses of the electronic device and to respectively generate first and second pairs of related horizontal and vertical analog output signals, said related horizontal and vertical analog output signals being respectively indicative of said first and second responses;

a second electronic circuit for receiving said pairs of related horizontal and vertical analog output signals from said first electronic circuit and to sequentially produce a first plurality of first pairs of related horizontal and vertical analog signature signals from said first pair of related horizontal and vertical analog output signals concurrently with the generation of said first pairs of output signals and then a second plurality of second pairs of related horizontal and vertical analog signature signals from said second pair of related horizontal and vertical analog output signals concurrently with the generation of said second pairs of output signals, said first plurality of first pairs of related horizontal and vertical analog signature signals corresponding to said first plurality of selected test conditions and said second plurality of second pairs of related horizontal and vertical analog signature signals corresponding to said second plurality of selected test conditions;

an analog-to-digital connector connected to said second electronic circuit for sequentially periodically sampling said first plurality of first pairs of analog signature signals and to produce digital signals;

an electronic digital memory for storing said digital signals;

a third electronic circuit for retrieving said stored digital signals from said electronic digital memory;

a digital-to-analog converter connected to said third electronic circuit for producing a reconstructed first plurality of first pairs of analog signature signals; and an analog visual display for simultaneously displaying said reconstructed first plurality of first pairs of analog signature signals and said second plurality of second pairs of analog signature signals.

25. An apparatus for comparing two electronic devices, comprising:

a switch having a plurality of selectable states, each state corresponding to one of a plurality of conditions under which the two electronic devices are to be compared;

a signal generator connected to said comparison condition switch for generating an analog input signal corresponding to said plurality of selected comparison conditions;

a first electronic circuit for alternately applying said input signal to the two electronic devices to alternatively produce a corresponding response of each of the two electronic devices and alternately generating corresponding pairs of related horizontal and vertical output signals indicative of said corresponding response;

a second electronic circuit for receiving said pair of related horizontal and vertical output signals from said first electronic circuit and to produce a plurality of pairs of related horizontal and vertical analog signature signals concurrently with the generation of said alternately corresponding paired related horizontal and vertical output signals, one of said plurality of pairs of related horizontal and vertical analog signature signals corresponding to each of said selected plurality of comparison conditions; and an analog visual display for simultaneously displaying said plurality of pairs of related horizontal and vertical analog signature signals for each of the devices, said one or more pairs of related horizontal and vertical analog signature signals for each of the devices being simultaneously displayed.

* * * * *